(12) United States Patent
Novak

(10) Patent No.: US 10,915,673 B2
(45) Date of Patent: Feb. 9, 2021

(54) DEVICE, METHOD, APPARATUS, AND COMPUTER-READABLE MEDIUM FOR SOLAR SITE ASSESSMENT

(71) Applicant: Scanifly, LLC, Hightstown, NJ (US)

(72) Inventor: John Novak, Bordentown, NJ (US)

(73) Assignee: SCANIFLY, LLC, Hightstown, NJ (US)

( * ) Notice: Subject to any disclaimer, the term of this patent is extended or adjusted under 35 U.S.C. 154(b) by 602 days.

(21) Appl. No.: 14/721,392

(22) Filed: May 26, 2015

(65) Prior Publication Data

US 2016/0004795 A1 Jan. 7, 2016

Related U.S. Application Data

(60) Provisional application No. 62/019,753, filed on Jul. 1, 2014.

(51) Int. Cl.
*B64C 39/02* (2006.01)
*G06F 30/20* (2020.01)

(52) U.S. Cl.
CPC ............ *G06F 30/20* (2020.01); *B64C 39/024* (2013.01); *B64C 2201/027* (2013.01); *B64C 2201/127* (2013.01)

(58) Field of Classification Search
CPC .. G06F 17/5004; G06F 17/5009; G06F 30/20; B64C 39/024; B64C 2201/027; B64C 2201/127
USPC .......................................................... 703/1
See application file for complete search history.

(56) References Cited

U.S. PATENT DOCUMENTS

| | | | |
|---|---|---|---|
| 7,500,391 B2 | 3/2009 | Woro | |
| 7,832,267 B2 | 11/2010 | Woro | |
| 2006/0061566 A1* | 3/2006 | Verma | G06T 17/20 345/419 |
| 2010/0217639 A1* | 8/2010 | Wayne | G06F 30/13 705/7.23 |
| 2011/0295575 A1* | 12/2011 | Levine | G06Q 30/02 703/2 |
| 2012/0278752 A1* | 11/2012 | Parker | G06F 16/29 715/780 |

(Continued)

OTHER PUBLICATIONS

Dereli, Z., C. Yucedag, and Joshua M. Pearce. "Simple and low-cost method of planning for tree growth and lifetime effects on solar photovoltaic systems performance." Solar Energy 95 (2013). pp. 300-307.*

(Continued)

*Primary Examiner* — Kamini S Shah
*Assistant Examiner* — John E Johansen
(74) *Attorney, Agent, or Firm* — Amardeep S. Grewal; Robert Riddle; Reed Smith LLP

(57) ABSTRACT

An Unmanned Aerial Vehicle (UAV), method, apparatus, and computer-readable medium for solar site assessment includes generating a three-dimensional model of a solar site based at least in part on data captured by an Unmanned Aerial Vehicle (UAV), importing one or more solar paths into the three-dimensional model based at least in part on a geo-location of the solar site, and determining, one or more solar collection estimates corresponding to one or more locations in the solar site based at least in part on the three-dimensional model and the one or more solar paths.

26 Claims, 32 Drawing Sheets

(56) References Cited

U.S. PATENT DOCUMENTS

| | | | |
|---|---|---|---|
| 2013/0282208 A1* | 10/2013 | Mendez-Rodriguez | G01S 17/933 701/16 |
| 2013/0339140 A1 | 12/2013 | Pokorny et al. | |
| 2014/0016857 A1* | 1/2014 | Richards | G06T 7/55 382/154 |
| 2014/0176543 A1* | 6/2014 | MacDonald | G01S 3/7868 345/420 |
| 2014/0316616 A1* | 10/2014 | Kugelmass | G08G 5/0013 701/8 |
| 2015/0234943 A1* | 8/2015 | Brier | G06F 30/13 703/1 |

OTHER PUBLICATIONS

Marsh, "Why Do Shading Calculations Take so Long?" ISSN: 1833-7570, Issue No. 004, Nov. 1, 2007. Accessed Online Jun. 29, 2018. pp. 1-15.*

Dereli, Z., C. Yucedag, and Joshua M. Pearce. "Simple and low-cost method of planning for tree growth and lifetime effects on solar photovoltaic systems performance." Solar Energy 95 (2013). pp. 300-307. (Year: 2013).*

Dereli, Z., C. Yucedag, and Joshua M. Pearce. "Simple and low-cost method of planning for tree growth and lifetime effects on solar photovoltaic systems perfornnance."%nbsp;Solar Energy 95 (2013). pp. 300-307. (Year: 2013).*

Marsh, "Why Do Shading Calculations Take so Long?" ISSN: 1833-7570, Issue No. 004, Nov. 1, 2007. Archive: pandora.nla.gov.au/pan/60916/20080822-0000/www.naturalfrequency.com/articles/shadingcalculations.html . Archived: Aug. 20, 2008. pp. 1-21. (Year: 2008).*

Dereli, Z., C. Yucedag, and Joshua M. Pearce. "Simple and low-cost method of planning for tree growth and lifetime effects on solar photovoltaic systems performance". Solar Energy. (2013). pp. 300-307. (Year: 2013).*

International Search Report and Written Opinion cited in corresponding International Application No. PCT/US15/32480 dated Jan. 11, 2016.

Woody, T. Drones Are Becoming Energy's New Roustabouts. Apr. 24, 2014, Retrieved from the Internet on Aug. 7, 2015: http://www.nytimes.com/2014/04/22/business/energy-environment/drones-are-becoming-energys-new-roustabouts.html?_r=0.

* cited by examiner

DEVICE, METHOD, APPARATUS, AND COMPUTER-READABLE MEDIUM FOR SOLAR SITE ASSESSMENT

RELATED APPLICATION DATA

This application claims priority to U.S. Provisional Application No. 62/019,753, filed Jul. 1, 2014, the disclosure of which is hereby incorporated by reference in its entirety.

BACKGROUND

Solar site assessment is the process of collecting data regarding the suitability of a location or the suitability of different points within a location for solar energy producing equipment, such as photovoltaic panels.

Solar site assessment is currently conducted using various physical shade analysis tools. One of these tools is the SunEye®, which is a handheld electronic tool that attempts to assess the available solar energy by day, month, and year by measuring the shading patterns of a particular site. Another tool is the Solar Pathfinder™, which uses a polished, transparent, convex plastic dome to give a panoramic view of a site. The convex dome is printed with a sun path diagram and when the dome is placed at a particular location, a user can take a picture of the reflection on the dome which will reflect the shading sources at the location relative to the sun path diagram.

One of the problems with the current physical shade analysis tools is that they are frequently inaccurate. For example, the SunEye® utilizes a fish eye lens which distorts captured images and can mislabel shade as sun and vice versa. Additionally, current methods are very time consuming, as they require an assessor to physically climb onto rooftops and perform the measurements at each potential location of a solar site. In additional to shading measurements, the assessment of whether a location is suitable for solar energy producing equipment requires the calculation of a number of other metrics for each potential location, including tilt angles and plane orientation, in order to evaluate the overall solar collection metrics for the potential location.

Furthermore, as the current tools require an assessor to physically climb onto rooftops, the current assessment process involves a high degree of risk of injury to the assessor. This is compounded for steep rooftops other treacherous terrain. Additionally, the data collection windows are restricted based on weather conditions, as rain, ice, snow, or wind can all make the task of rooftop solar assessment prohibitively dangerous.

DETAILED DESCRIPTION

While methods, apparatuses, and computer-readable media are described herein by way of examples and embodiments, those skilled in the art recognize that methods, apparatuses, and computer-readable media for solar site assessment are not limited to the embodiments or drawings described. It should be understood that the drawings and description are not intended to be limited to the particular form disclosed. Rather, the intention is to cover all modifications, equivalents and alternatives falling within the spirit and scope of the present disclosure. Any headings used herein are for organizational purposes only and are not meant to limit the scope of the description or the claims. As used herein, the word "may" is used in a permissive sense (i.e., meaning having the potential to) rather than the mandatory sense (i.e., meaning must). Similarly, the words "include," "including," and "includes" mean including, but not limited to.

There is currently no efficient and accurate way to assess sites (such as rooftop sites) for suitability for photovoltaic (solar) systems. For example, in-person inspection of rooftop sites is both time and labor intensive, as well as potentially dangerous for any individuals conducting the inspection.

The Applicant has discovered and developed new technology which allows for efficient and accurate solar site assessment for a photovoltaic system with minimal personnel risk. The disclosed Unmanned Aerial Vehicle (UAV) and related methods and systems increase the efficiency and accuracy of data collection and decrease liabilities when performing data collection tasks relating to solar site assessment.

Figure 1:
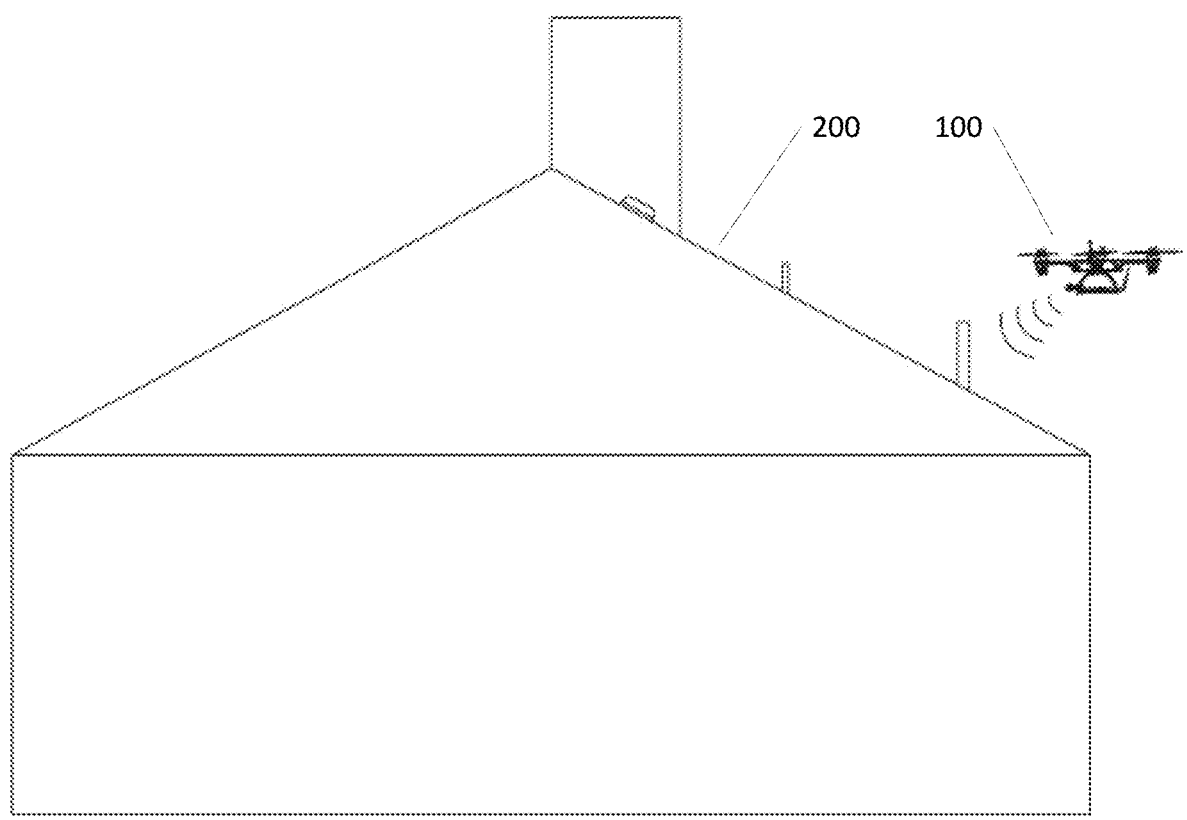
FIG. 1 illustrates an Unmanned Aerial Vehicle (UAV) for solar site assessment according to an exemplary embodiment.

FIG. 1 illustrates a UAV 100 for conducting solar site assessment according to an exemplary embodiment. As shown in the figure, the UAV 100 can easily maneuver to different sites, such as rooftop sites on roof 200, to conduct solar site assessment.

Figure 2:
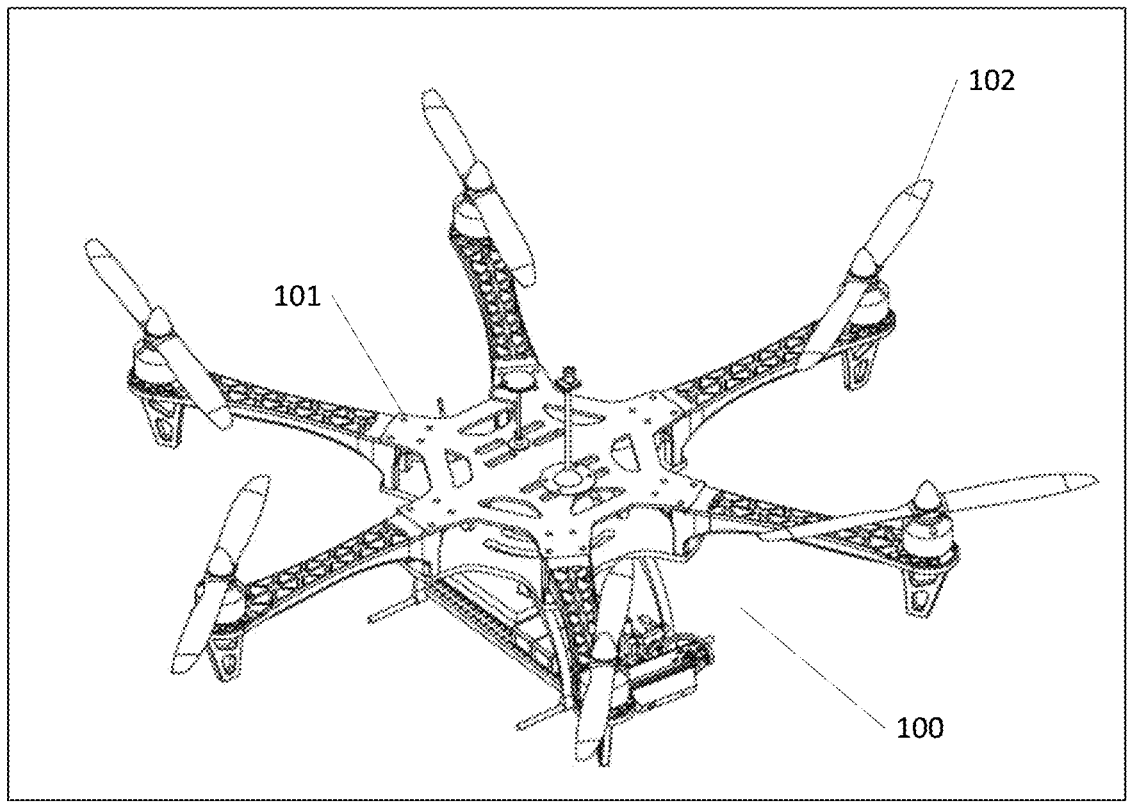
FIG. 2 illustrates various components of the UAV according to an exemplary embodiment.

FIG. 2 illustrates the UAV 100 in greater detail. UAV 100 includes one or more one or more propellers 102 coupled to a frame 101. The UAV 100 shown in the figure includes six propellers, but this is for illustration only, and the actual number can be higher or lower. For example, the UAV can have eight propellers or four propellers. Additionally, the UAV can utilize alternative displacement mechanisms. For example, the UAV can include multiple rotors to provide lift and thrust, similar to a helicopter.

Figure 3:
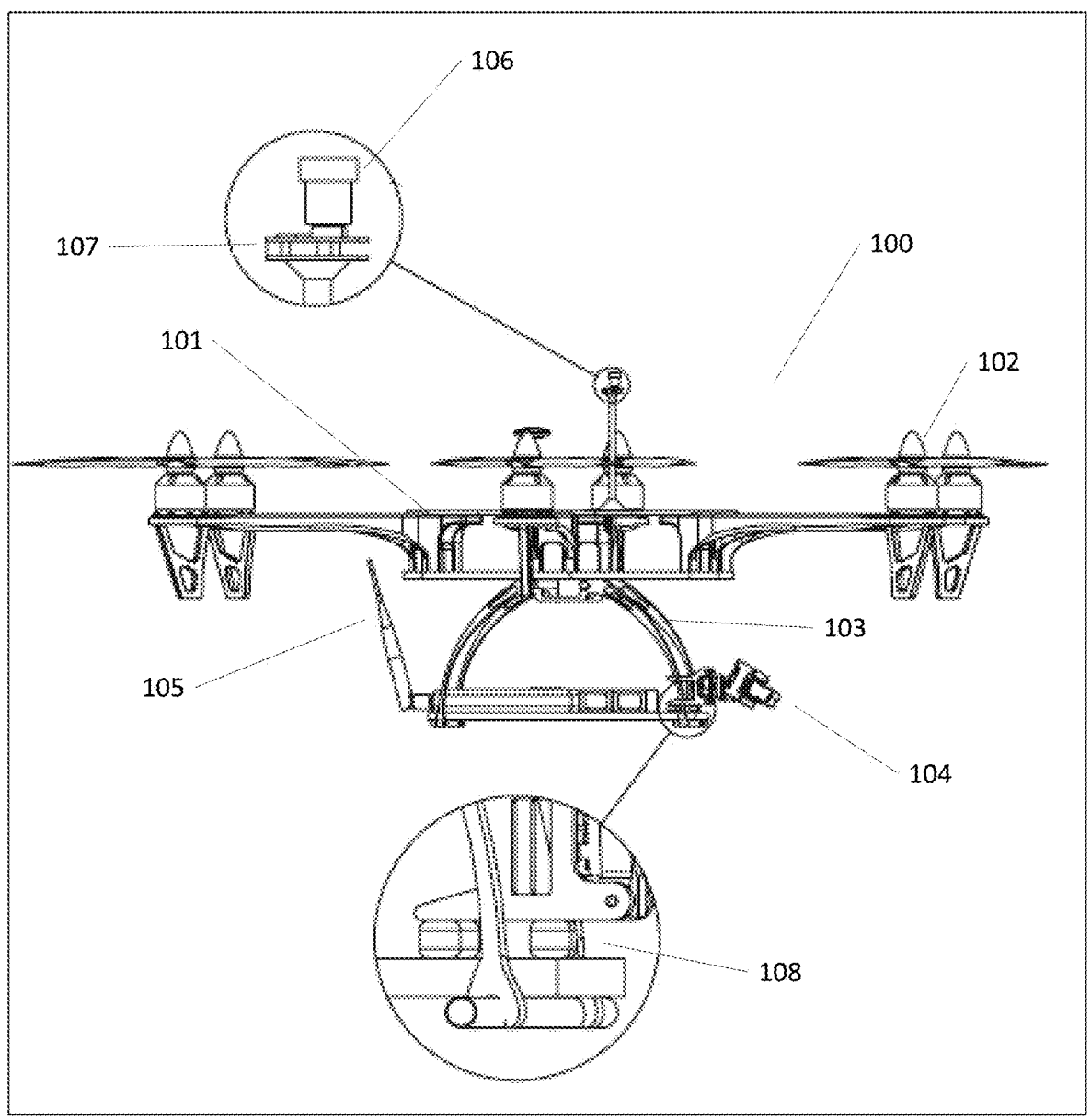
FIG. 3 illustrates additional components of the UAV according to an exemplary embodiment.

FIG. 3 illustrates a side-view of the UAV 100. The UAV includes one or more three-dimensional sensors 104 coupled to the frame 101 via a gimbal assembly 103 and configured to collect three-dimensional data of a site below and around the UAV 100. The one of more three dimensional sensors 104 can be mounted on one or more vibration dampeners 108 coupled to a portion of the gimbal assembly 103 and disposed between a portion of the gimbal assembly and the one or more three dimensional sensors.

The gimbal assembly is controllable to aim the one or more three dimensional sensors. The gimbal assembly can include a communications module within the gimbal assembly. The communications module can transmit at least one directional optical signal to communicate data collected by the sensor. At least one transducer is positioned to receive the at least one directional electromagnetic signal.

The three-dimensional sensors can include laser based projection technology such as time-of-flight three-dimensional scanners that use laser light to probe the subject and a laser rangefinder to find the distance of a surface by timing the round-trip time of a pulse of light.

The three-dimensional sensors can also include triangulation based three-dimensional scanners. For example, the three-dimensional sensors can include an optical scanning device based on the triangulation principle, in particular for point by point optical measurement of the measurement points of the object surface and for determining inner measuring point coordinates in an inner scanning coordinate system, a referencing arrangement for generating referencing information, in particular an outer measuring position and measuring orientation of the scanning device, for referencing the inner measurement point coordinates in the outer object coordinate system and an evaluation unit for determining the three dimensional coordinates of the measurement points in the outer object coordinate system depending on the inner measurement point coordinates and the referencing information, so that the inner measurement point coordinates are present as three dimensional coordinates in the outer object coordinate system.

Additionally, a microcontroller can be part of the UAV and can be configured such that the UAV, taking into account respective current inner measurement point coordinates determined by the three-dimensional sensors device and/or taking into account an object surface predefined by a digital model, is moved along a flight path defined by the digital model while being automatically controlled relative to the object surface while maintaining a predefined range of measuring distances, in particular a measuring distance. For example, the measuring distance can be kept at a predefined distance capture the highest quality images based on the specification of the one or more three-dimensional sensors.

The microcontroller of the UAV can also be configured such that the UAV can be moved and oriented relative to the object surface under automatic control depending on a measuring position and measuring orientation of the three-dimensional sensors that can be determined using the referencing arrangement, in particular continuously determined, and/or on a measuring distance to the object surface that can be determined using the three-dimensional sensors.

The information captured by the three-dimensional sensors can be communicated to other components in the UAV via wired or wireless communication, such as Bluetooth, radio signals, or any other wireless transmission system.

The UAV 100 also includes a lens 106 coupled to the frame 101 and extending above the one or more propellers 102. The lens 106 can be mounted on one or more vibration dampeners 107, which are disposed between the lens 106 and the frame 101. The lens 106 is configured to collect solar trajectory information associated with the site which the UAV is currently inspecting. The lens can be any lens, or combinations of lenses, suitable for collecting solar trajectory data. For example, the lens can be a wide angle lens which captures solar trajectory information for a large range of angles relative to the site.

Additionally, any information detected by the three-dimensional sensors or the lens can be captured with an image capture, video capture, or scanning device that can be part of the UAV. The scanning device can be an optical scanning apparatus such as a line scanner, a strip projection scanner and/or a camera.

UAV can also include a transceiver 105 which is configured to transmit the three-dimensional data and the solar trajectory data and receive one or more instructions. The transceiver 105 can be part of, or communicatively coupled to, the microcontroller which sends instructions to the components of the UAV 100 and receives data from the components of the UAV 100. The transmitted data can sent directly to a computing device which performs calculations and further processes the data, or the data can be sent to a server where it can be stored for later retrieval and analysis.

Additionally, information captured by the three-dimensional sensors or the lens can be transformed using one or more computing devices on the UAV prior to transmission. For example, planar surfaces detected by the one or more three-dimensional sensors can be converted into a surface model prior to transmission by the UAV.

Information can be transmitted to and from the UAV using radio signals or using signals that are transmitted to the UAV by cable, via infrared or via Bluetooth. In addition, power can be supplied to the air vehicle via a cable, which connects the air vehicle to a remote control and/or to the referencing arrangement. Alternatively, the UAV can be battery powered, gas powered, or solar powered utilizing one or more photovoltaic panels which can be part of the UAV.

The UAV 100 can include one or more actuators configured to adjust the gimbal assembly 103 and aim the one or more three-dimensional sensors 104. Instructions can be received by the transceiver 105 and sent to the one or more actuators via the microcontroller.

The UAV can include a measuring system which enables the measurement of objects and the position of the UAV relative to objects such that the positioning of the UAV takes place fully automatically. The UAV can also include a theodolite, a tachymeter, Geographic Positioning System (GOS), a Global Navigation Satellite System (GNSS), acceleration sensors, turn rate sensors, a magnetic compass, an IMU (Inertial Measurement Unit), orientation sensors, and/or a dead-reckoning system to aid in navigation and movement.

Figure 4:
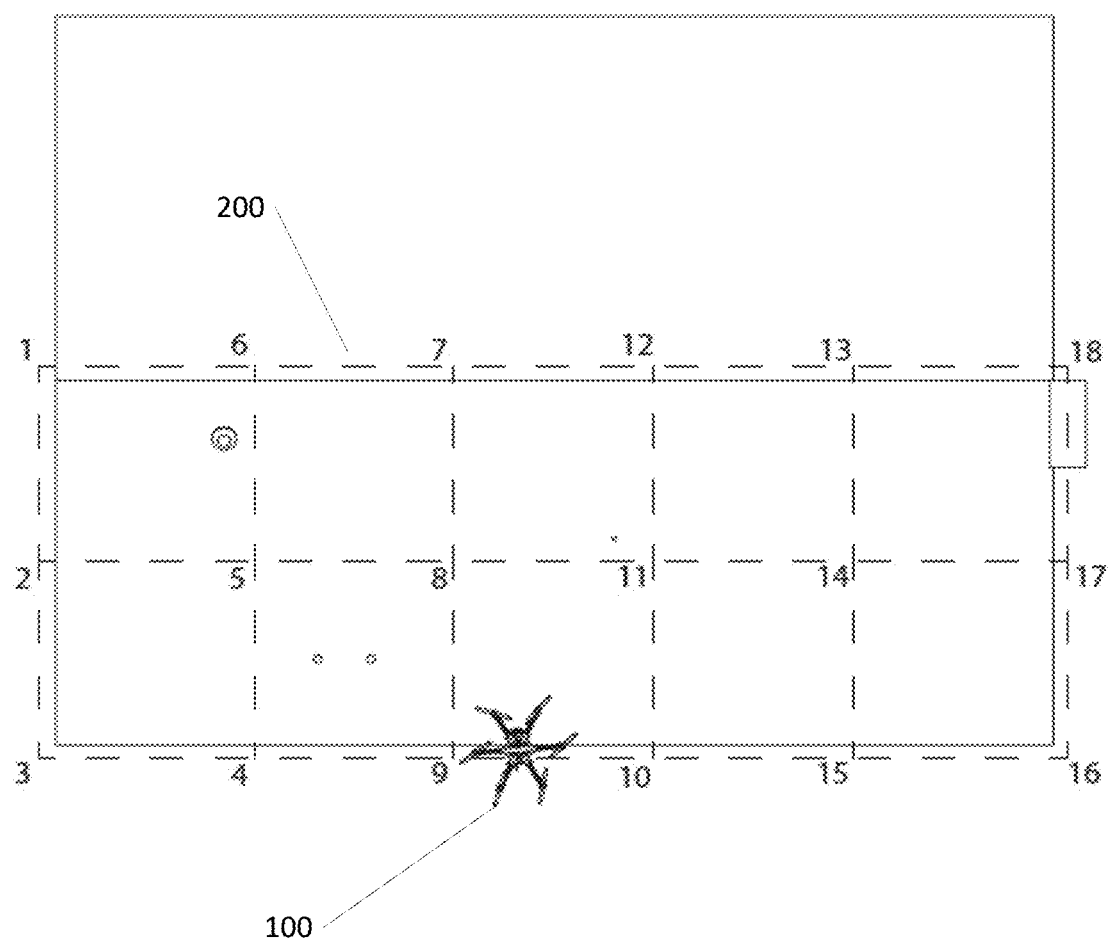
FIG. 4 illustrates a number of rooftop sites to be assessed by the UAV according to an exemplary embodiment.

Turning to FIG. 4, the operation of the UAV 100 will now be described. As discussed earlier, the UAV 100 can receive one or more instructions via the transceiver. When conducting an assessment of a plurality of sites, the one or more instructions can include instructions to travel to a plurality of predefined geo-coordinates corresponding to the plurality of sites, as well as a predefined route. The UAV can then autonomously navigate to each of the locations based on the received geo-coordinates. Of course, the UAV can also be guided to different locations manually using some remote control mechanism in communication with the transceiver.

Figure 5:
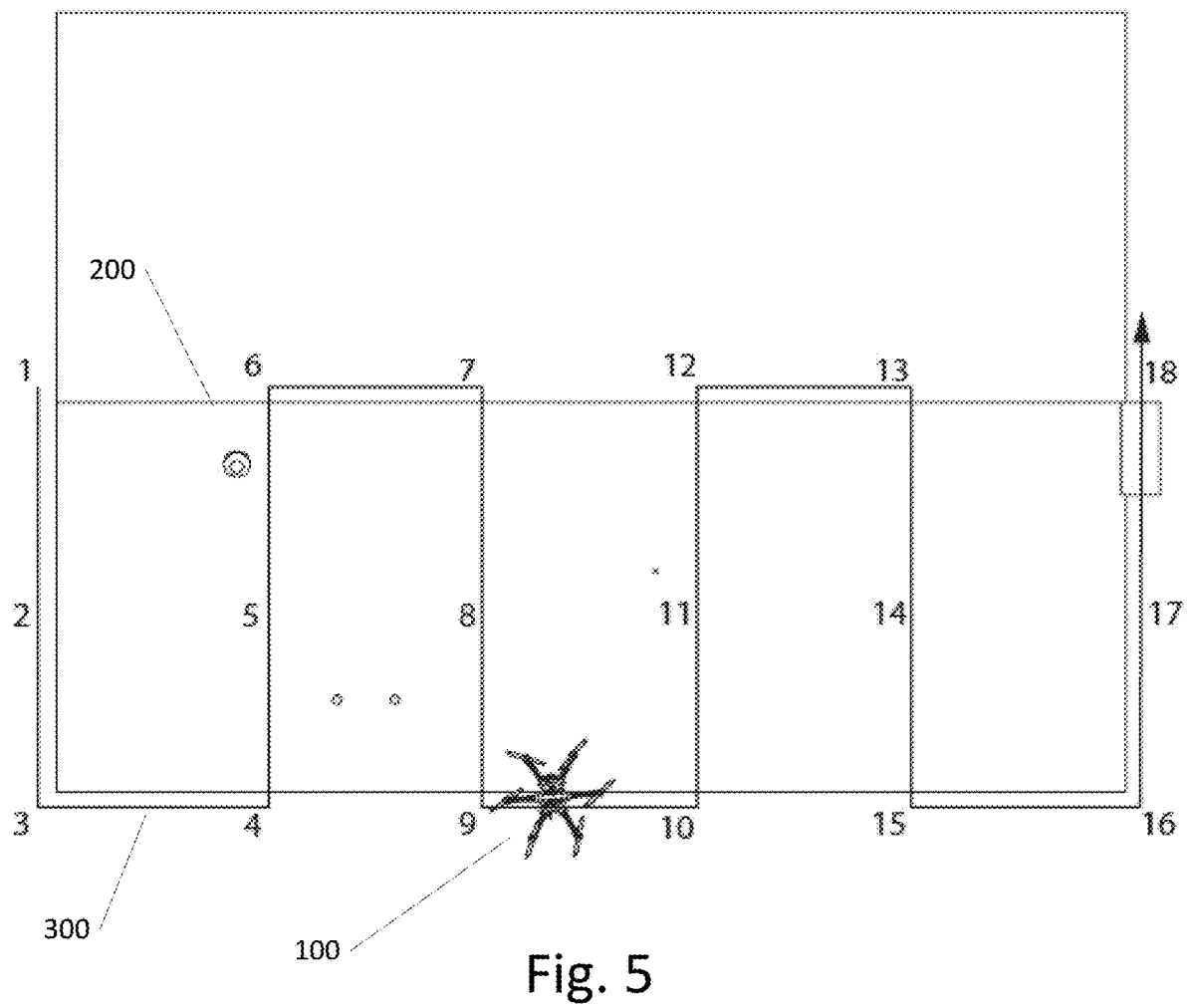
FIG. 5 illustrates a route taken by the UAV to assess the rooftop sites according to an exemplary embodiment.

For example, the UAV 100 in FIG. 4 is conducting an assessment of eighteen different sites on rooftop 200. The UAV can receive eighteen different geo-coordinates corresponding to each of the sites, as well as a predefined route for navigating between each of the geo-coordinates. The controller can transmit the movement instructions to the one or more propellers or other displacement mechanisms to move the UAV to each of the plurality of predefined geo-coordinates in the predefined route. FIG. 5 illustrates the route 300 that the UAV 100 takes in moving between each of the eighteen sites on the rooftop 200. Additionally, the UAV can utilize the one or more three dimensional sensors to aid in navigation and avoid obstructions.

Figure 6:
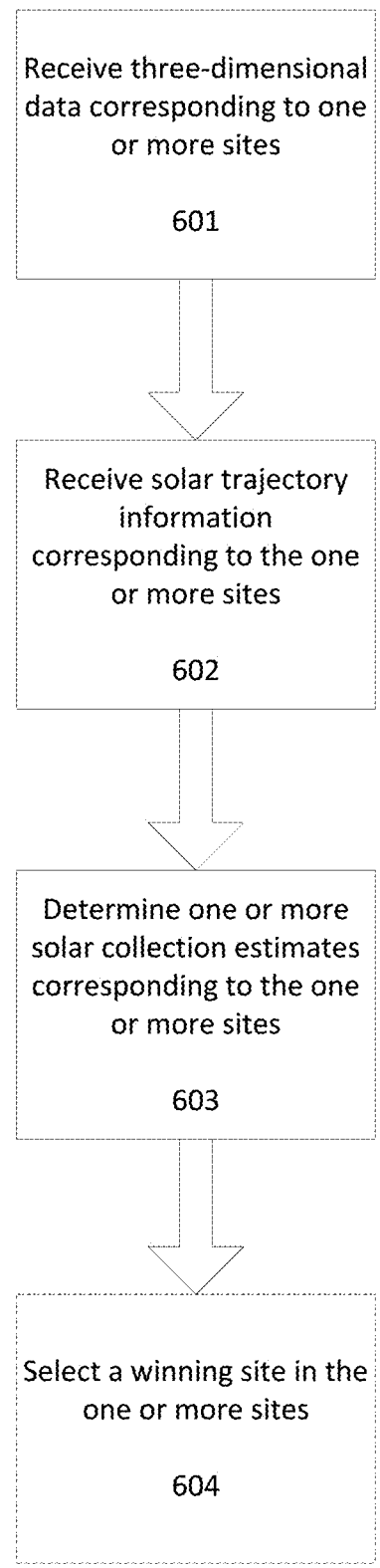
FIG. 6 is flowchart showing a method for solar site assessment according to an exemplary embodiment.

FIG. 6 is flowchart showing a method for solar site assessment according to an exemplary embodiment. At step 601 three-dimensional data corresponding to one or more sites is received. For example, if there are two sites, then two sets of three-dimensional data can be received, each set corresponding to a respective site. The three-dimensional data can be captured by an Unmanned Aerial Vehicle (UAV), such as the UAV discussed in reference to FIGS. 1-5. The data can be received directly from the UAV or from a server which stores the data captured by the UAV.

At step 602 solar trajectory information corresponding to the one or more sites is received. For example, if there are two sites, then two sets of solar trajectory information can be received, each set corresponding to a respective site. The solar trajectory information can be captured by an Unmanned Aerial Vehicle (UAV), such as the UAV discussed in reference to FIGS. 1-5. The information can be received directly from the UAV or from a server which stores the information captured by the UAV.

At step 603 one or more solar collection estimates corresponding the one or more sites are determined based at least in part on the three-dimensional data and the solar trajectory information.

Optionally, at step 604, a "winning" site can be selected from among the one or more sites based at least in part on the one or more solar collection estimates. For example, the "winning" site can be the site that receives the most overall solar energy throughout the day. Alternatively, the "winning site" can be determined based on some combination of total solar energy received at each site and ease of access, expense, risk, costs, or some other measure relating to installation of a photovoltaic panel at each site.

Figure 7:
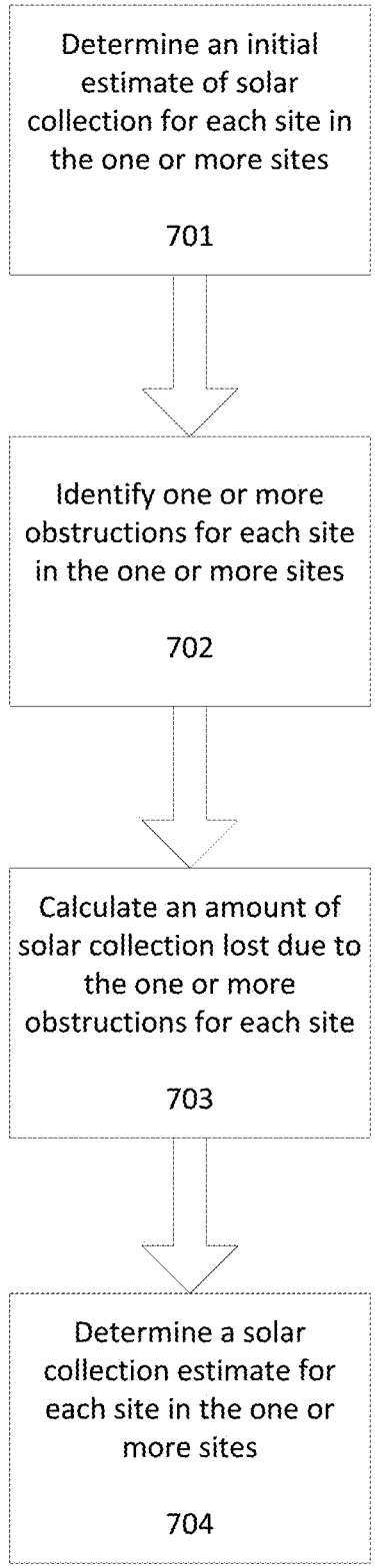
FIG. 7 is a flowchart showing a method for determining one or more solar collection estimates corresponding to one or more sites according to an exemplary embodiment.

FIG. 7 is a flowchart showing a method for determining one or more solar collection estimates corresponding to the one or more sites according to an exemplary embodiment. At step 701 an initial estimate of solar collection for each site in the one or more sites is determined based at least in part on the three-dimensional data and the solar trajectory information. For example, the initial estimate can take into account the location and orientation of the site relative to solar trajectories at different points in time throughout the day.

At step 702 one or more obstructions are identified for each site in the one or more sites based at least in part on the three-dimensional data and the solar trajectory information. Identifying one or more obstructions for each site can include identifying one or more potential obstructions based at least in part on the three-dimensional data and determining whether any of the one or more potential obstructions lie in a solar trajectory to the site based at least in part on the solar trajectory information. This can include examining multiple solar trajectories or projected solar trajectories throughout the day.

At step 703 an amount of solar collection lost due to the one or more obstructions is calculated for each site in the one or more sites. This can including determining a degree of shading for the site based at least in part on an analysis of the one or more obstructions and the solar trajectory information, such as the azimuth and altitude of the sun's path. The degree of shading can determined based at least in part on physical dimensions of the one or more obstructions, such as height, length, width, etc. The degree of shading can also take into account material properties of the obstruction, such as degree of transparency, thickness, etc.

At step 704 the solar collection estimate for each site in the one or more sites is determined by subtracting the amount of solar collection lost from the initial estimate of solar collection.

Figure 8:
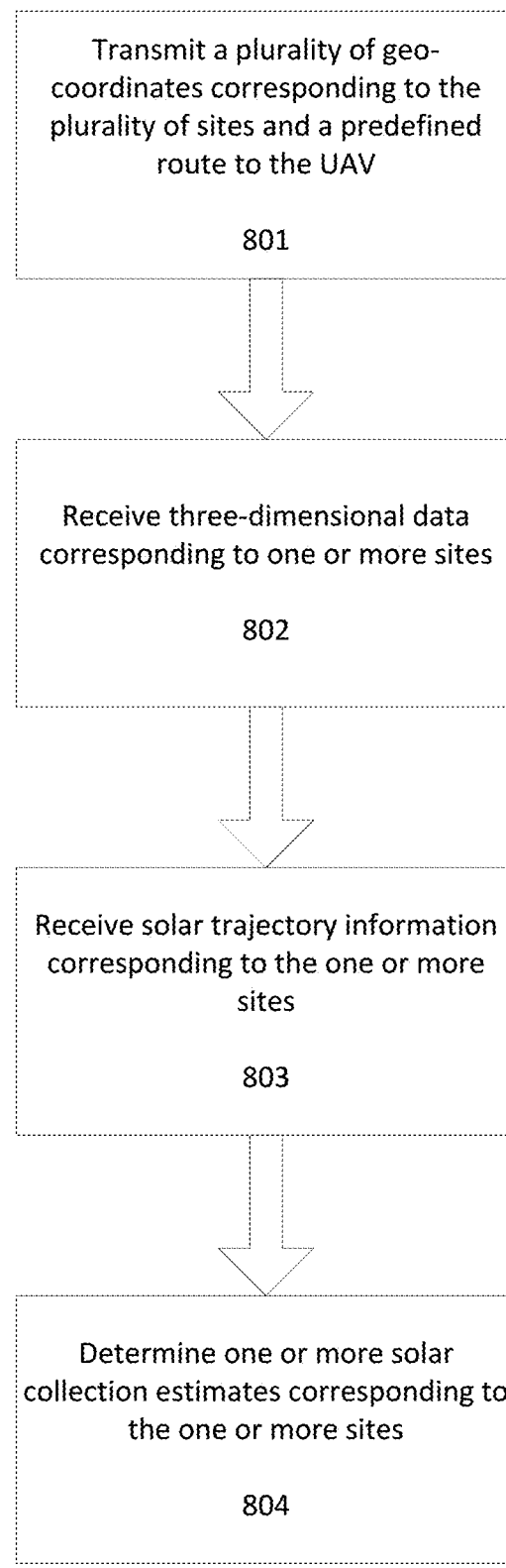
FIG. 8 flowchart showing a method for solar site assessment for a plurality of sites according to an exemplary embodiment.

FIG. 8 flowchart showing a method for solar site assessment for a plurality of sites according to an exemplary embodiment. At step 801 a plurality of geo-coordinates corresponding to the plurality of sites and a predefined route are transmitted to the UAV prior to receiving any gathered from the UAV.

As discussed earlier, the UAV can be configured to move to each of the plurality of geo-coordinates using the predefined route and gather the relevant three-dimensional data and solar trajectory information for that site. The three-dimensional data and solar trajectory information for each site can be bundled with the corresponding site information using an appropriate data structure. For example, the three-dimensional data and solar trajectory information for a first site can be linked to an object representing the first site, or can be stored in a class object defined for the first site. Many variations are possible and these examples are not intended to be limiting.

At step 802 three-dimensional data corresponding to the plurality of sites is received as described with reference to FIG. 6. At step 803 solar trajectory information corresponding to the one or more sites is received as described with reference to FIG. 6. At step 804 one or more solar collection estimates corresponding the one or more sites are determined based at least in part on the three-dimensional data and the solar trajectory information as described with reference to FIG. 6.

Figure 9A:
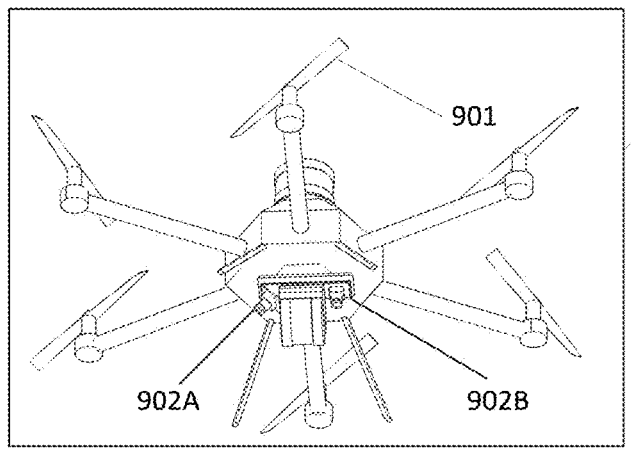
FIGS. 9A-9F illustrate multiple views of another UAV for solar site assessment according to an exemplary embodiment.

FIG. 9A illustrates another UAV 900 for conducting solar site assessment according to an exemplary embodiment. UAV 900 includes one or more propellers, such as propeller 901, coupled to a frame. UAV 900 also includes one or more cameras, such as cameras 902A and 902B, coupled to the frame. The cameras can be coupled to one or more actuators configured to control their direction, tilt, and orientation.

Figure 9B:
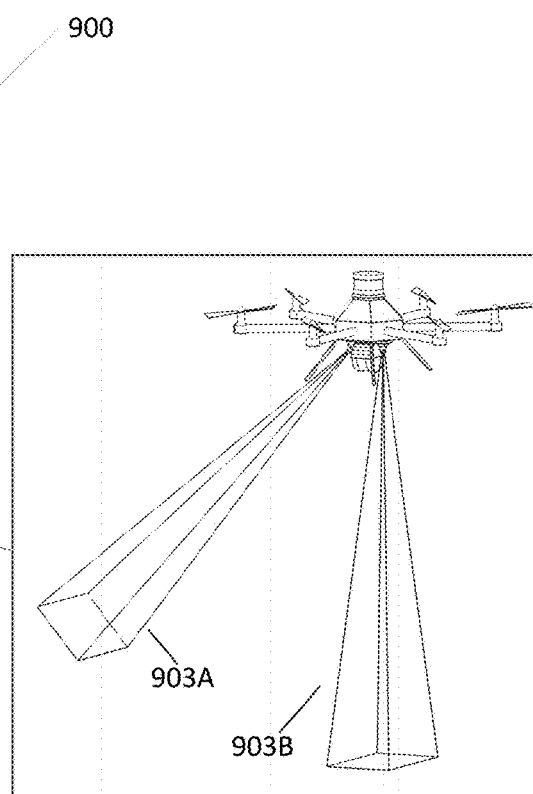

The cameras are configured to capture a plurality of images of a solar site, with each of the plurality of images being geo-tagged with the location of the UAV at the time of image capture. FIG. 9B illustrates an example of the image capture areas 903A and 903B of cameras 902A and 902B. The cameras can be triggered by a change in location of the UAV, such that cameras are configured to capture an image of the solar site based on a determination that the location of the UAV has shifted by a predetermined distance relative to the solar site. This predetermined distance can be input by a user or set to some default value based on the solar site being assessed. Alternatively, the cameras can take time-lapse photographs of the solar site, such that the cameras are configured to capture an image of the solar site based on a determination that a predetermined amount of time has passed. As the UAV moves about the solar site, these time-lapse images will capture portions of the solar site from different perspectives.

Geo-tagging of the images can be performed automatically as each image is captured or after all images are captured based on a flight log which records the location of the UAV at different times and cross-references the times in the flight log with timestamps on the images to identify a location corresponding to each image. The geo-tagging can be performed by a controller on the UAV 900 or by a controller within the one or more cameras. After the images are captured and geotagged, they can be transmitted by a wireless transmitter that is part of the UAV. Alternatively, the images can be transmitted without being geotagged and then geotagged at a server or other external computing device based on a flight log and timestamps in the photos, as discussed above.

Figure 9C:
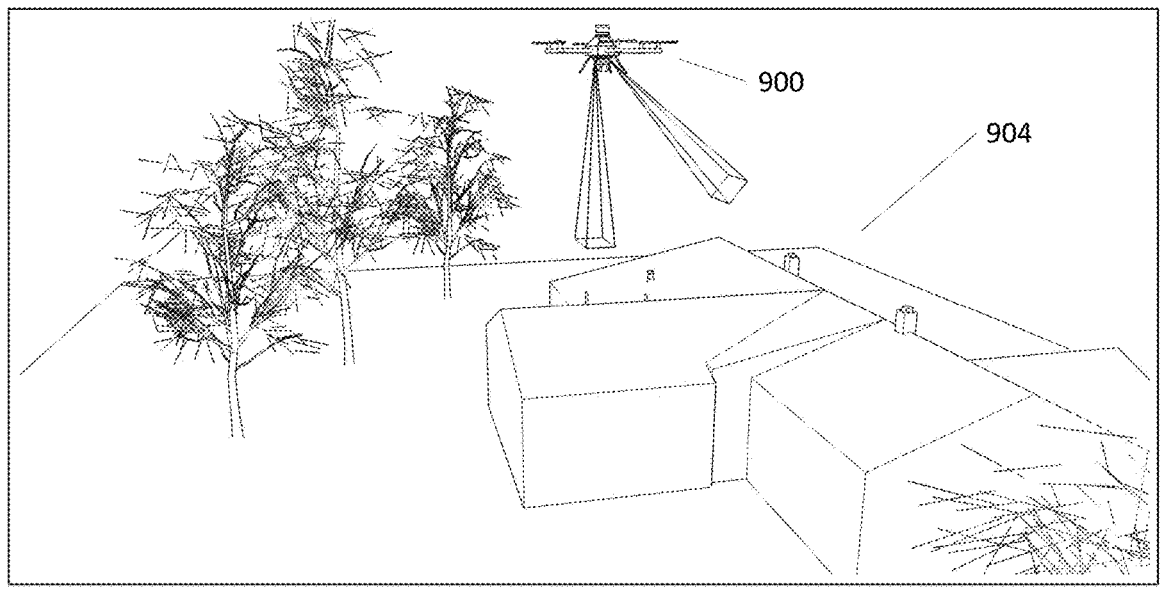

The location of the UAV can be monitored by a Global Positioning Satellite (GPS) device configured to track a location of the UAV as it surveys a solar site, such as solar site 904 shown in FIG. 9C. The global positioning device can be embedded in one or more components of the UAV, such as the cameras, or can be a separate component in communication with one or more components of the UAV. Location information for the UAV at any given moment can include a latitude value, a longitude value, and an elevation or altitude value.

Figure 9D:
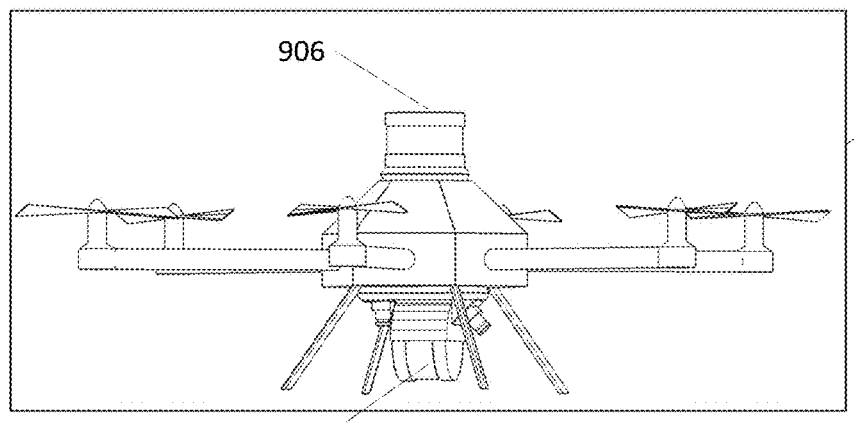

As shown in FIG. 9D, the UAV 900 can include one or more three-dimensional sensors, such as sensor 906, coupled to the frame and configured to collect three-dimensional data of the solar site. The three-dimensional sensors can utilize laser based technology, such as LiDAR.

Figure 9E:
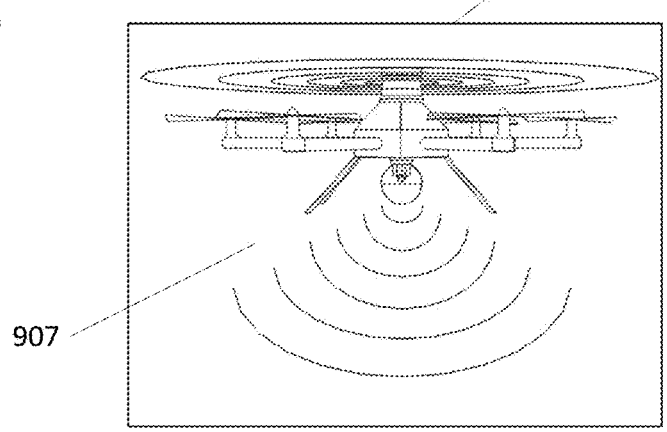
Figure 9F:
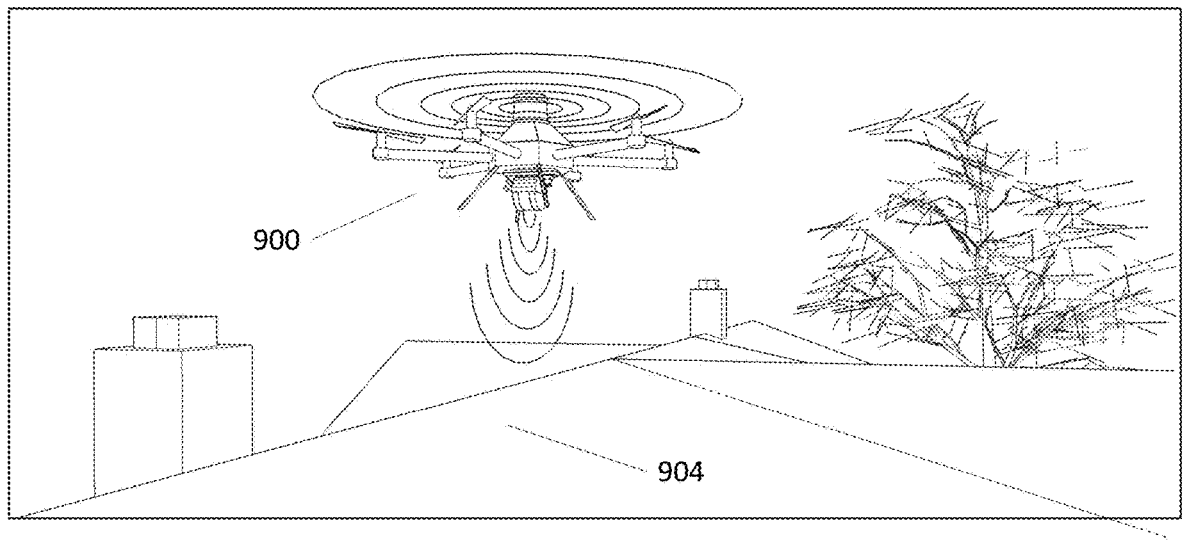

UAV 900 can also include a depth sensor 905 coupled to the frame and configured to detect a vertical distance between the UAV and a surface of the solar site. The depth sensor can include a projector, such as an infrared laser projector, and a sensor configured to detect objects underneath the UAV. FIG. 9E illustrates the projections 907 of the depth sensor 905 and FIG. 9E illustrates an example of the UAV 900 using the depth sensor to stay a predetermined distance above a surface of the solar site 904 which is beneath it. This predetermined distance can be input by a user or can be some default value based on the particular solar site. The depth sensor can therefore be used as a crash preventer. In this case, if the depth sensor detects a decrease in depth such that the depth falls below a predetermined distance, it can discontinue flying in its current direction.

The UAV can be guided either manually via remote control, or autonomously using a predefined set of geo-coordinate nodes/waypoints and one or more of the depth sensor and three-dimensional sensor. The depth sensor allows for a safe distance from objects, preventing the UAV from accidentally crashing into the object it is scanning (such as by maintaining a predetermined distance from objects).

The solar site can include one or more structures being assessed for suitability for solar installations and one or more obstructions which lie in a solar trajectory to at least one of the one or more structures. The UAV can then scan rooftops and other surfaces of the one or more structures in the solar site, as well as all obstructions, and the area surrounding the rooftops such as trees or other structures using its cameras and/or sensors.

The planer surfaces in the solar site can be detected by one or more 3D sensors. Additionally, the images captured by the cameras can be used for photogrammetry, as will be described further below. The UAV components, such as the sensors and/or camera can be mounted on a gimbal assembly, which can itself be mounted using a set of vibration dampeners. Any of the UAV components can be adjusted autonomously based on a pre-programmed routine or via manual remote control using one or more actuators coupled to the components. The individual components of the UAV, such as the sensors or the camera, can also be configured to connect to the internet and to simultaneously collect, compress, and send data to a server in the background while the UAV is in flight.

The UAV can include a receiver which is configured to receive instructions from a user or from an external computer or program. The instructions can include instructions to travel to a plurality of predefined geo-coordinates (waypoints) in a predefined route, to capture images in a certain direction, and/or to scan certain areas using a three-dimensional sensor. The instructions can be transmitted to the UAV components, such as the propellers, the camera, the depth sensor, and/or the depth sensor via a controller on the UAV. Additionally, the correct distance (in the Z direction/elevation) from a roof plane and any obstructions can be defined per waypoint.

Figure 10A:
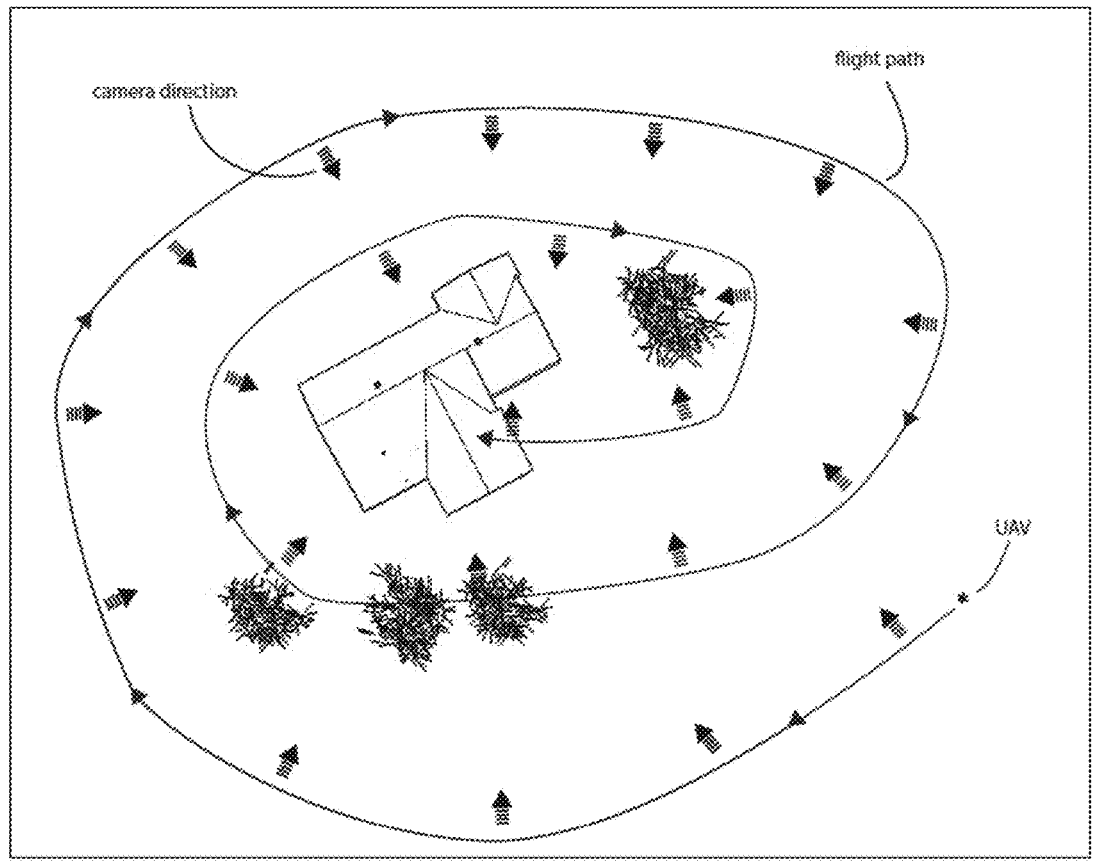
FIGS. 10A-10E illustrate multiple route patterns and route characteristics according to an exemplary embodiment.

A controller of a UAV which receives a plurality of predefined geo-coordinates corresponding to a route can then transmit the instructions to one or more propellers to move the UAV to each of the plurality of predefined geo-coordinates in the predefined route. For example, FIG. 10A illustrates a predefined route in the shape of a spiral towards the center of the solar site. As shown in FIG. 10A, the orientation of the UAV cameras can also be part of the predefined route.

Figure 10B:
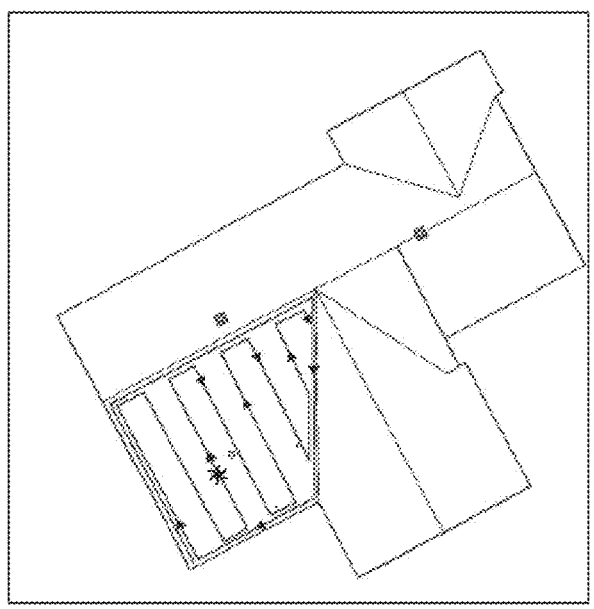
Figure 10C:
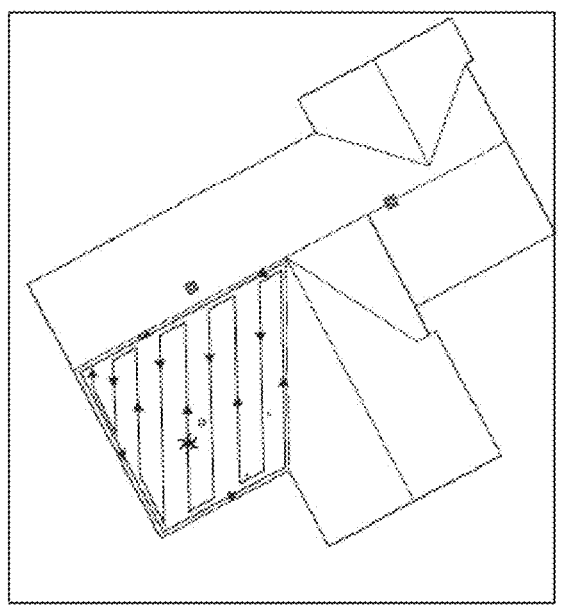
Figure 10D:
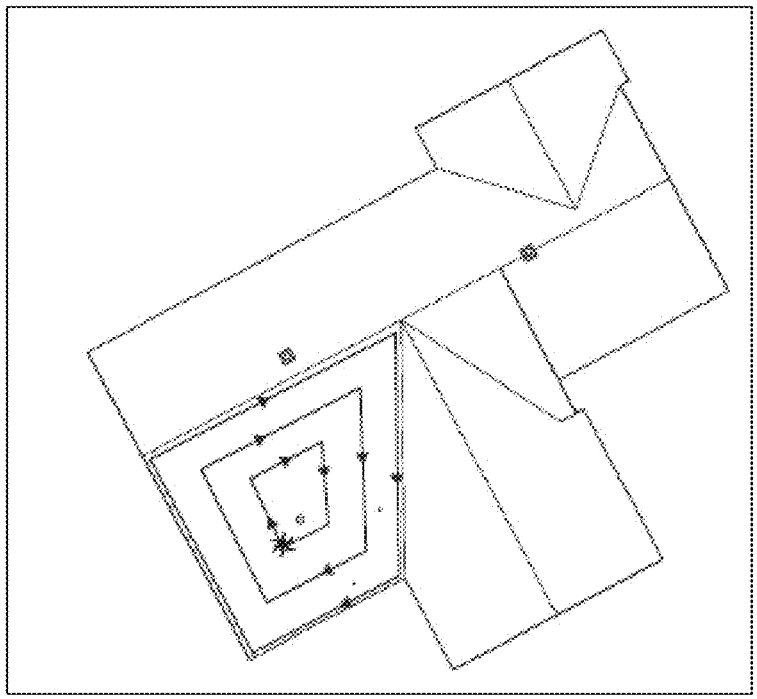
Figure 10E:
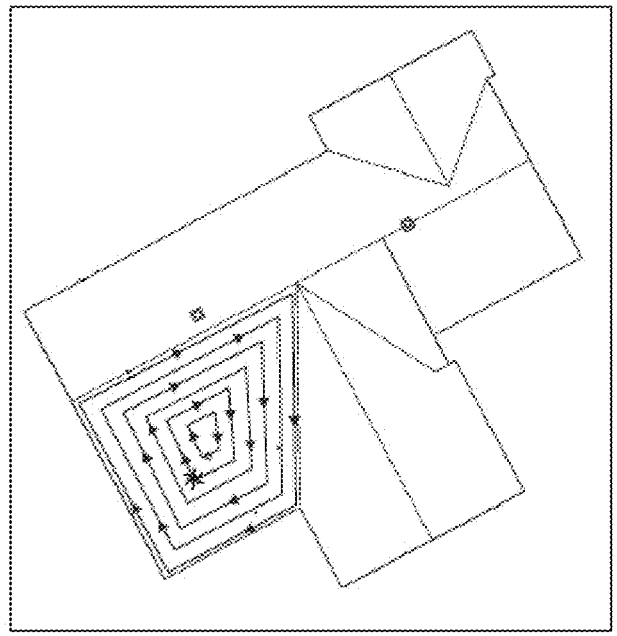

The route can be defined by at least one of a pattern, density, and angle and a user can adjust these parameters to adjust the route which the UAV follows. For example, FIG. 10B illustrates rectilinear route, whereas FIG. 10C illustrates a rectilinear route with a different pattern angle. Similarly, FIG. 10D illustrates concentric route, whereas FIG. 10D illustrates a concentric route with a different pattern density. A variety of patterns can be selected for the route and the specific pattern can be customized to the particular solar site which is being assessed. Patterns can include Honeycomb, Concentric, Line, Rectilinear, Hilbert Curve, Archimedean Chords, Octagram Spiral, and any other patterns which achieve coverage of a particular solar site.

Figure 11:
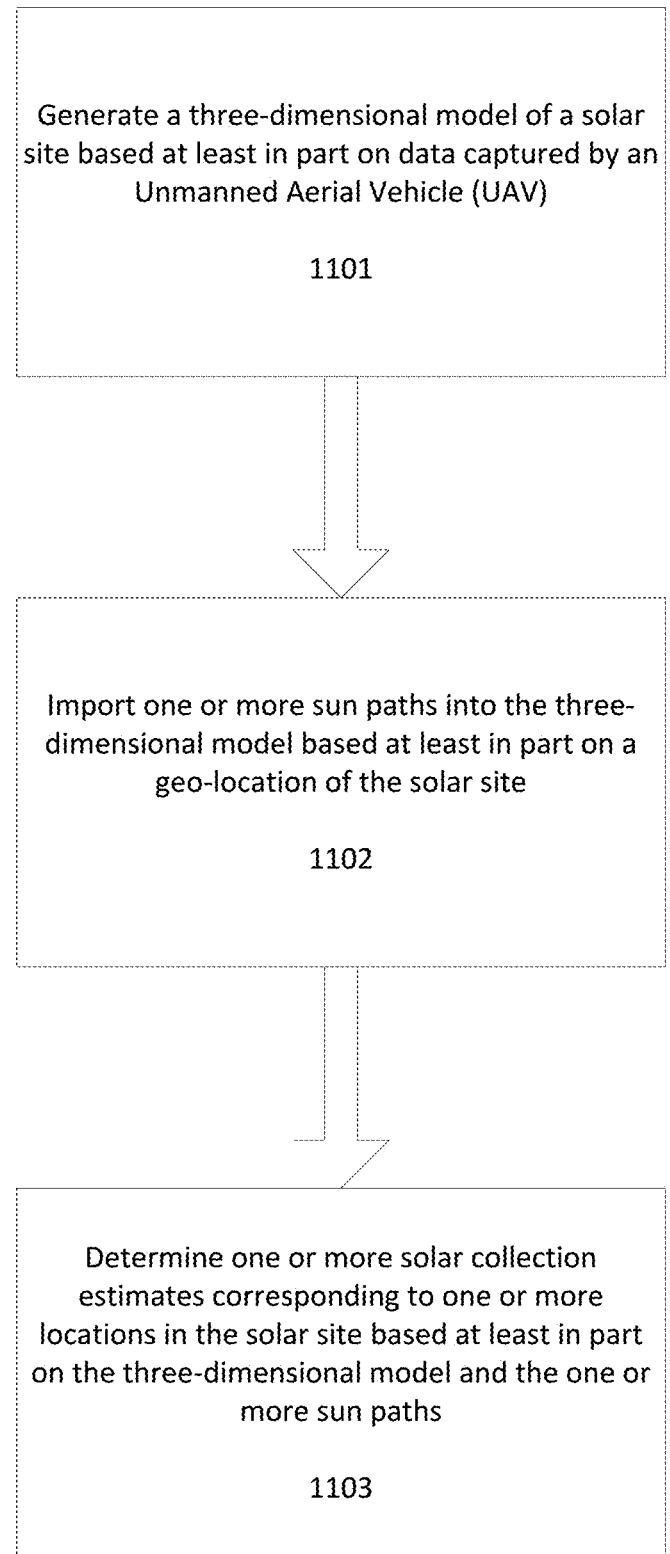
FIG. 11 is a flowchart for solar site assessment according to an exemplary embodiment.

FIG. 11 is a flowchart for solar site assessment according to an exemplary embodiment. At step 1101 a three-dimensional model of a solar site is generated based at least in part on data captured by an Unmanned Aerial Vehicle (UAV). As is described below, the three-dimensional model of the solar site can be generated in a variety of ways.

Figure 12:
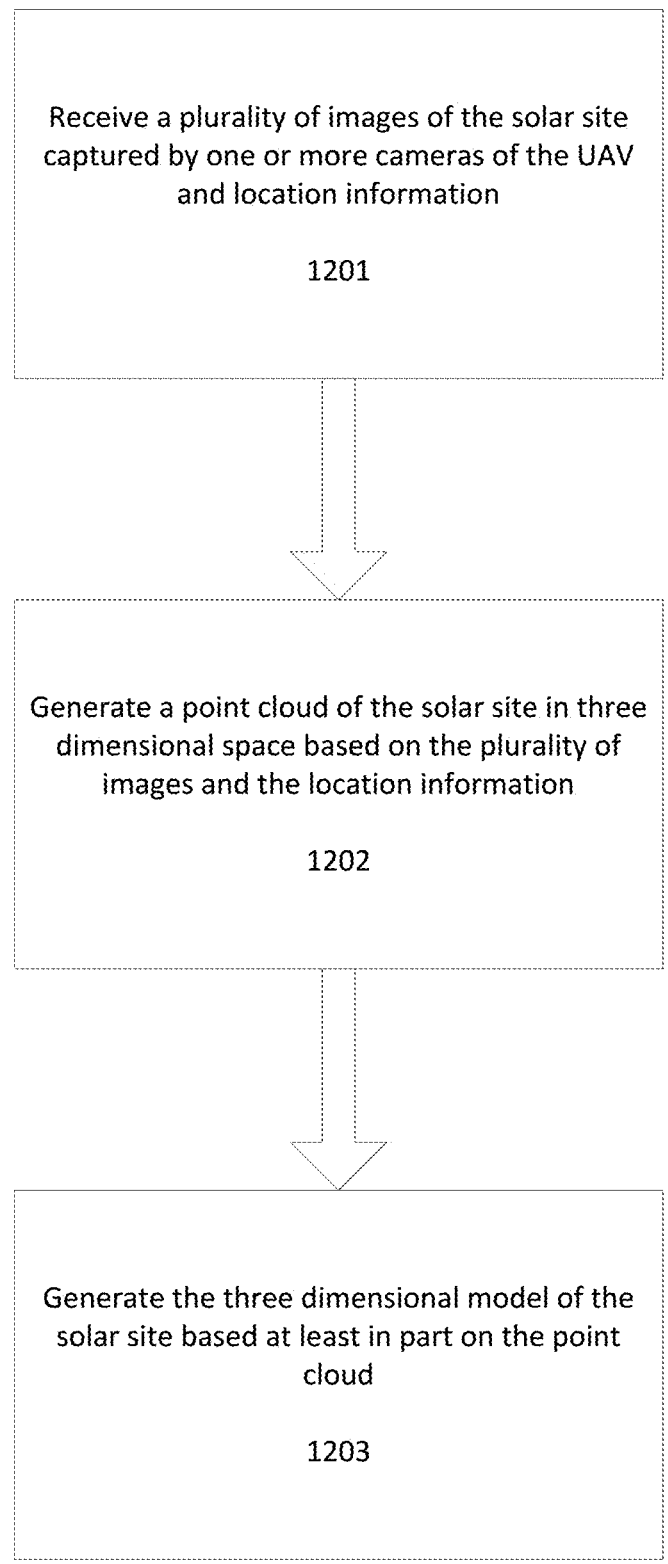
FIG. 12 illustrates a flowchart for generating the three-dimensional model of a solar site based at least in part on data captured by a UAV according to an exemplary embodiment.

FIG. 12 illustrates a flowchart for generating the three-dimensional model of a solar site based at least in part on data captured by a UAV according to an exemplary embodiment. At step 1201 a plurality of images of the solar site captured by one or more cameras of the UAV are received. Each of the plurality of images is geo-tagged with location information corresponding to the location of the UAV at the time of image capture. The location information of the UAV can be tracked using a GPS sensor as described in reference to the earlier figures of the UAV and can include latitude, longitude, and altitude/elevation, as discussed earlier.

As discussed earlier the images can be captured based on a change in location of the UAV, such that cameras are configured to capture an image of the solar site based on a determination that the location of the UAV has shifted by a predetermined distance relative to the solar site. This predetermined distance can be input by a user or set to some default value based on the solar site being assessed. Alternatively, the images can be time-lapse images of the solar site, such that the cameras are configured to capture an image of the solar site based on a determination that a predetermined amount of time has passed. As the UAV moves about the solar site, these time-lapse images will capture portions of the solar site from different perspectives.

At step 1202 a point cloud of the solar site is generated in three-dimensional space based at least in part on the plurality of images and the corresponding location information for each of the plurality of images. This point cloud can be a sparse or dense point cloud based on the number of data points collected. As is discussed further below, both sparse and dense point clouds have a number of associated advantages and disadvantages and the type of point clous can be customized to the solar site parameters.

Figure 13:
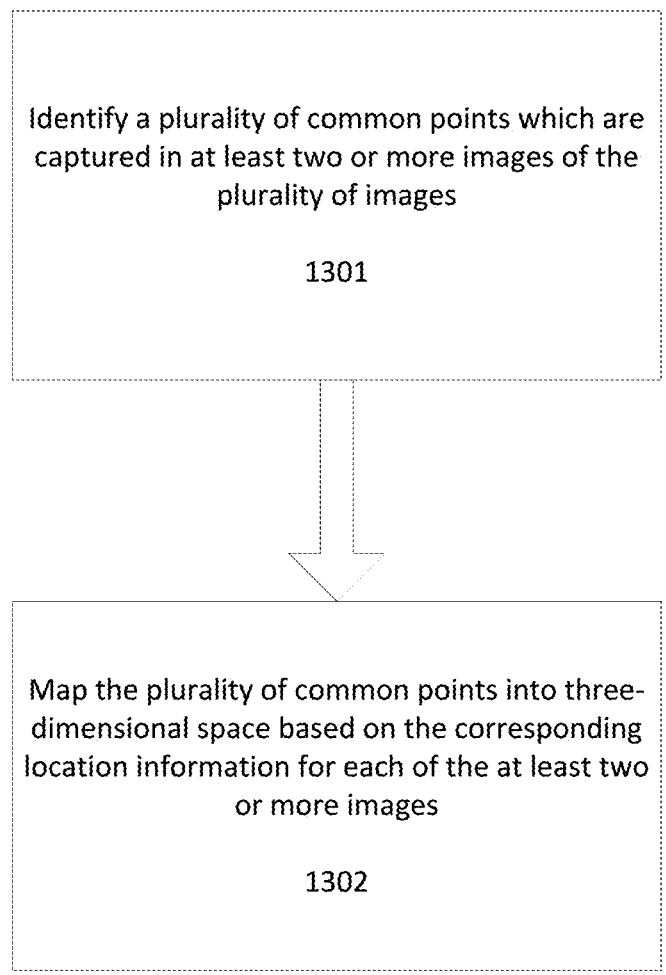
FIG. 13 illustrates a flowchart for generating the point cloud according to an exemplary embodiment.

FIG. 13 illustrates a flowchart for generating the point cloud according to an exemplary embodiment. At step 1301 a plurality of common points which are captured in at least two or more images of the plurality of images are identified. As used herein, common points refer to points in the images which correspond to the same underlying physical point in the solar site. In other words, points in the images which correspond to the same point in three-dimensional space.

At step 1302 the plurality of common points are mapped into three-dimensional space based on the corresponding location information for each of the at least two or more images. This can be performed using photogrammetry techniques which triangulate the position of the common points in three dimensional space based on a variety of perspectives of the common points and the position of the UAV for each of those perspectives. In other words, the images are used to identify similarities between structures and overlap. Once the similarities and overlap are identified, the latitude, longitude an elevation/altitude information corresponding to each of the images which have overlapping points are used to calculate three-dimensional coordinates for the common points. Once coordinates for the common/overlapping points are determined, the remaining points can be added to the three-dimensional point cloud based on their relative distances to the common points.

As discussed earlier, the location information can be derived based on a timestamp corresponding to each of the images and a flight log which tracks the location of the UAV at different times using a GPS device. Alternatively, the images can be geotagged as they are captured with the GPS location data. Additionally, one or more ground control points can be utilized to further improve the accuracy of the geo-referenced points in the point cloud.

Returning to FIG. 12, once the point cloud is generated, then at step 1203, the three-dimensional model of the solar site is generated based at least in part on the point cloud. This step is performed by recognizing planes and surfaces of the solar site based on the density and distribution of the points in the point cloud and forming a polygon mesh corresponding to those planes and surfaces.

Figure 14:
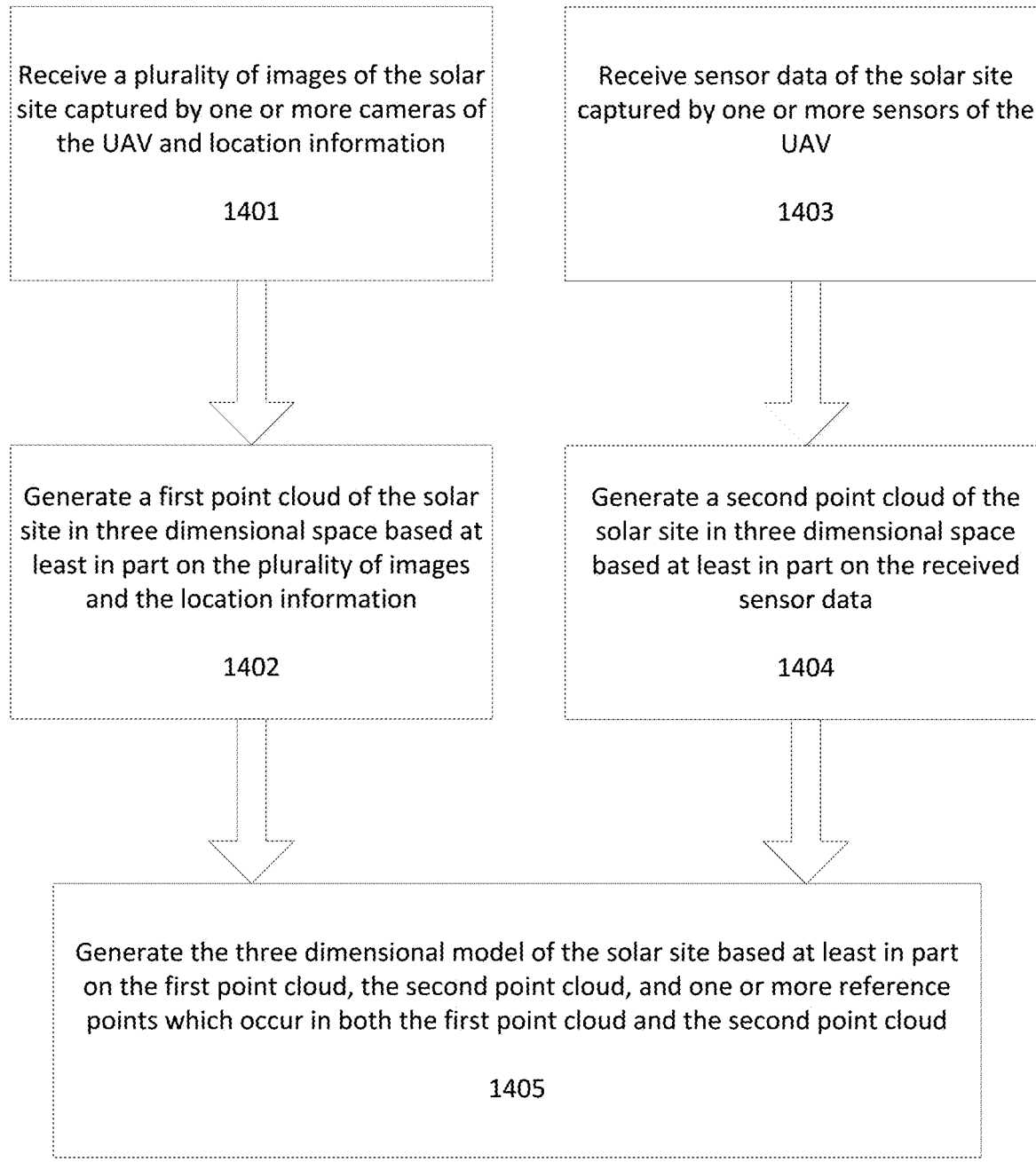
FIG. 14 illustrates another flowchart for generating a three-dimensional model of the solar site according to an exemplary embodiment.

FIG. 14 illustrates another flowchart for generating a three-dimensional model of the solar site according to an exemplary embodiment. Steps 1401 and 1402 are similar to steps 1201 and 1202 of FIG. 12, in that they involve receiving a plurality of images of the solar site captured by one or more cameras of the UAV, wherein each of the plurality of images is geo-tagged with location information corresponding to the location of the UAV at the time of image capture and generating a first point cloud of the solar site in three-dimensional space based at least in part on the plurality of images and the corresponding location information for each of the plurality of images.

At step 1403 sensor data of the solar site captured by one or more sensors of the UAV is received. The one or more sensors can include the three-dimensional sensor (such as LiDAR) and/or the depth sensor. At step 1404 a second point cloud of the solar site is generated in three-dimensional space based at least in part on the received sensor data. The second point cloud can be generated based on three-dimensional data captured by a three-dimensional sensor or on three dimensional data captured by a combination of the depth sensor and the GPS device which tracks the location of the UAV. In this case, the depth sensor can be used to lock on to a depth to perform a more granular level scan of a surface in the solar site.

At step 1405 a three-dimensional model of the solar site is generated based at least in part on the first point cloud, the second point cloud, and one or more reference points which occur in both the first point cloud and the second point cloud. By combining the first point cloud generated using photogrammetry techniques and the images with a second point cloud generated from one of the sensors (such as the LiDAR sensor) aboard the UAV, the accuracy and resolution of the resulting three-dimensional model can be increased.

Figure 15:
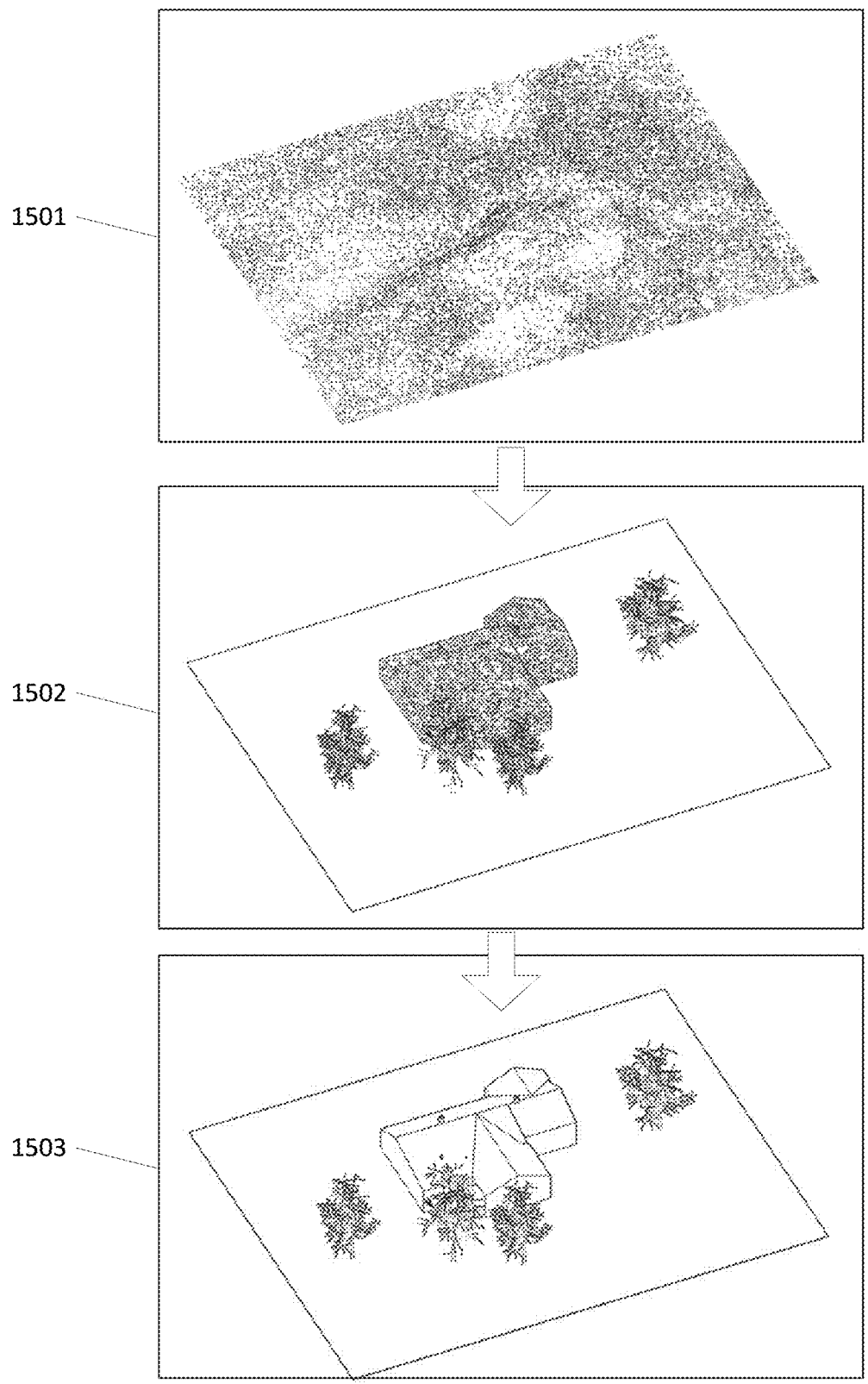
FIG. 15 illustrates the process for generating the three-dimensional model from the point cloud according to an exemplary embodiment.

FIG. 15 illustrates the process for generating the three-dimensional model from the point cloud. An initial sparse point cloud of a solar site is shown in window 1501. This sparse point cloud can be based on low density of data points relative to a dense point cloud, which is shown in window 1502. The sparse point cloud can represent the early stages of the point cloud, prior to the mapping of additional data points into three dimensional space. Window 1503 illustrates the three dimensional model that is generated from the dense point cloud in window 1502.

Of course, one or more additional steps can take place between the low polygon model shown in window 1503 and the dense point cloud shown in window 1502. For example, a high polygon mesh model can be generated based on the dense point cloud and then converted into a low polygon model.

The mesh model has a high polygon count when converted from the dense point cloud. As a result, the mesh model can be difficult to manage since the high number of polygons place a strain on the processor of the computer which is rendering the polygons. In general, the more dense the point cloud, the higher the polygon count, leading to additional strain placed on the computer. However, a higher polygon count (and more dense point cloud) also provides benefits such as higher resolution.

In order to obtain the best balance of accuracy and speed, one or more custom data processing techniques can be applied based on characteristics of the solar site which is being modeled. Custom data processing techniques can include utilizing a dense point cloud for relatively small solar sites (such as those below a certain square footage, surface area, or cubic volume) and utilizing a sparse point cloud for large solar sites (such as those above a certain square footage, surface area, or cubic volume). The custom data processing techniques can also include modifying the three dimensional model.

Figure 16:
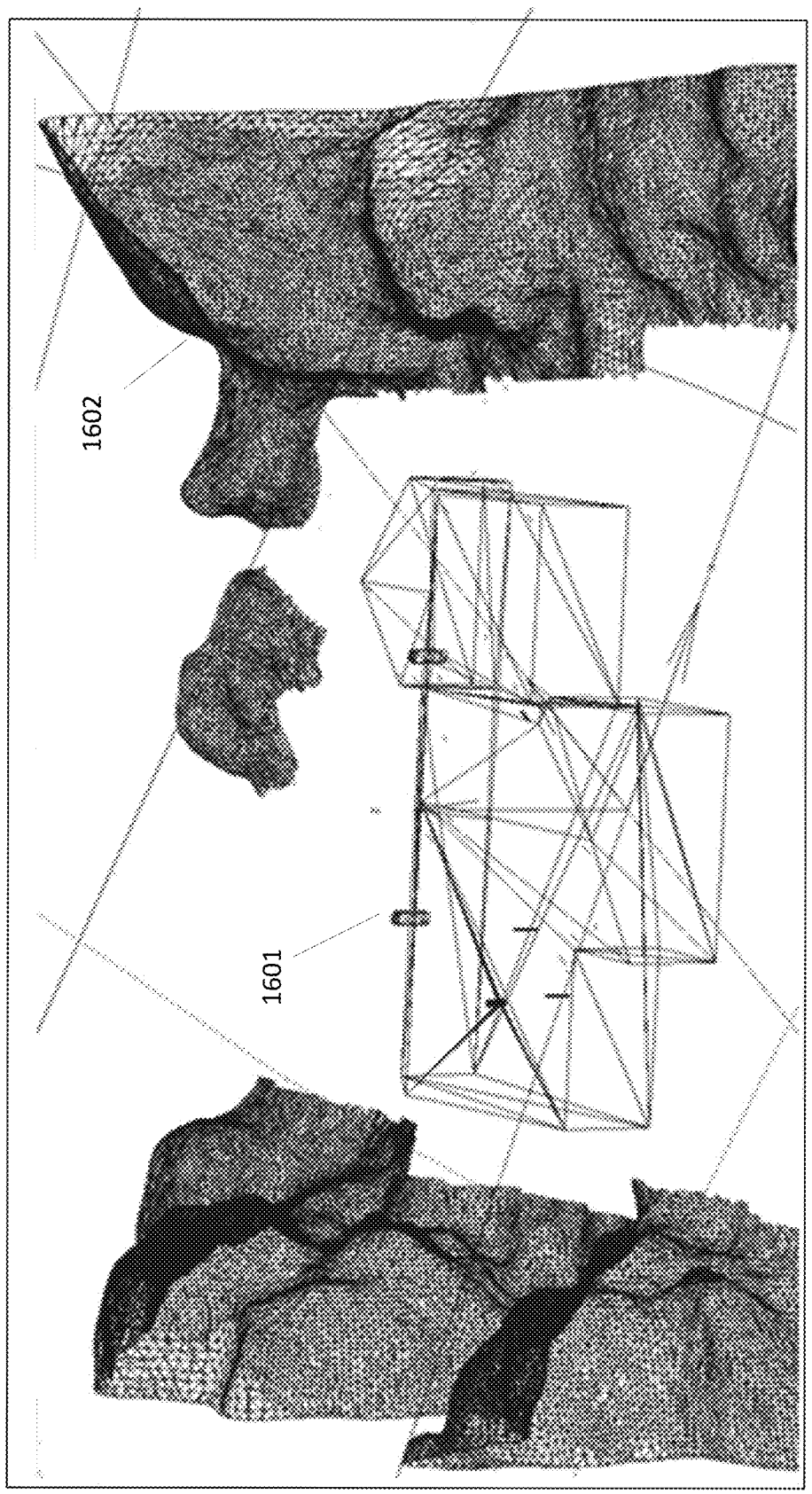
FIG. 16 illustrates a three-dimensional model which has been modified according to an exemplary embodiment.

For example, the three dimensional model can be modified to reduce the number of polygons used to render one or more objects in the three-dimensional model of the solar site. FIG. 16 illustrates a three-dimensional model which has been modified to reduce the number of polygons used to render objects corresponding to a building 1601 in the solar site but to leave the surrounding areas 1602 at the same polygon count. Polygon reduction for building objects can be performed by tracing the high polygon mesh model corresponding to the building objects as a wire frame. Alternatively, polygon reduction can be performed by decreasing the number of polygons used to render the mesh.

The three dimensional model can also be modified remove one or more objects in the three-dimensional model which are below a predetermined elevation. For example, bushes and shrubs that are below the level of a roof on a building typically do not factor in to solar site or shading analysis and can be removed without impacting the solar site assessment.

Figure 17A:
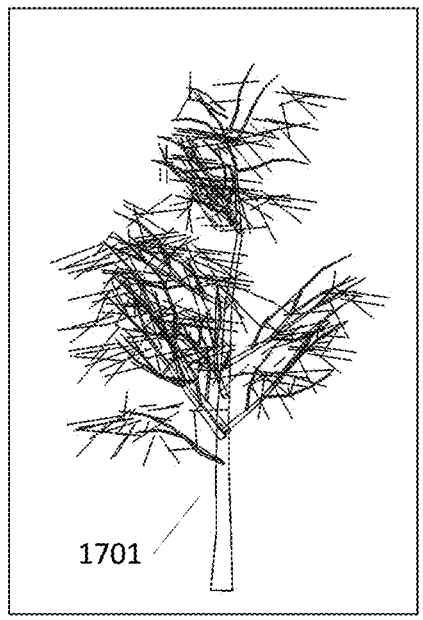
FIGS. 17A-17C illustrate a mesh model and hemispherical viewshed corresponding to a tree according to an exemplary embodiment.
Figure 17B:
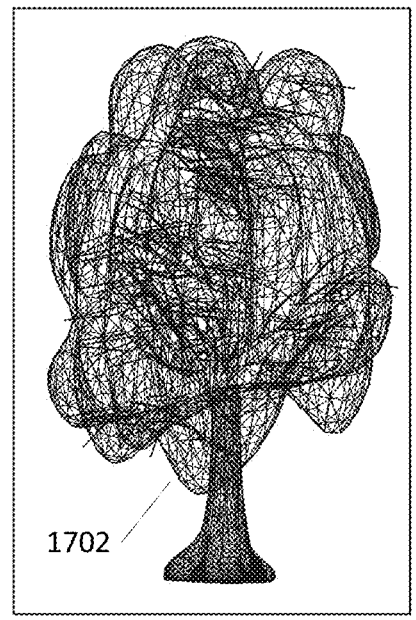
Figure 17C:
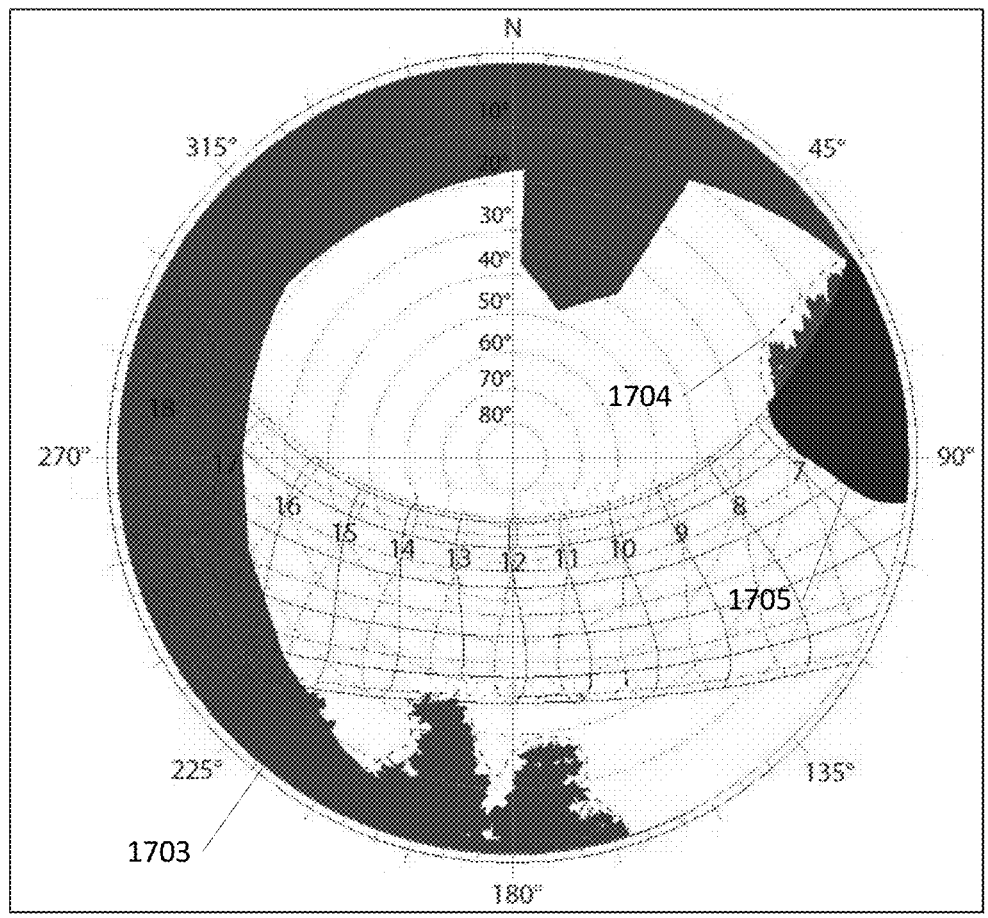

However, in many situations, it is desirable to leave portions of the polygon mesh unmodified due to inaccuracies that would be caused by reducing polygon count. For example, when generating three-dimensional models of trees from a point cloud, the mesh model for the trees can take the appearance of a three-dimensional outline of the tree and does not pick up details of the tree such as branches and foliage. FIG. 17A illustrates a tree 1701 for which the corresponding mesh model 1702 is shown in FIG. 17B. The mesh model of the tree is reflected in the hemispherical viewshed 1703 (hemispherical viewsheds are discussed in greater detail below) as outline 1704 and results in the shading reflected by the dark area 1705. If this mesh were manipulated, the dimensions of the tree would not be accurate, and therefore the shading report would not be accurate. Therefore the one or more custom data processing techniques can be configured so as not to apply any polygon reduction to trees or other vegetation which appears in a hemispherical viewshed.

Returning to FIG. 11, after the three-dimensional model is generated (or alternatively prior to generating the three-dimensional model), one or more solar paths are imported into the three-dimensional model based at least in part on a geo-location of the solar site at step 1102. If this step is performed prior to generation of the three-dimensional model, then the one or more sunpaths can be imported into three-dimensional space and the three-dimensional model can be added to the three-dimensional space.

Figure 18A:
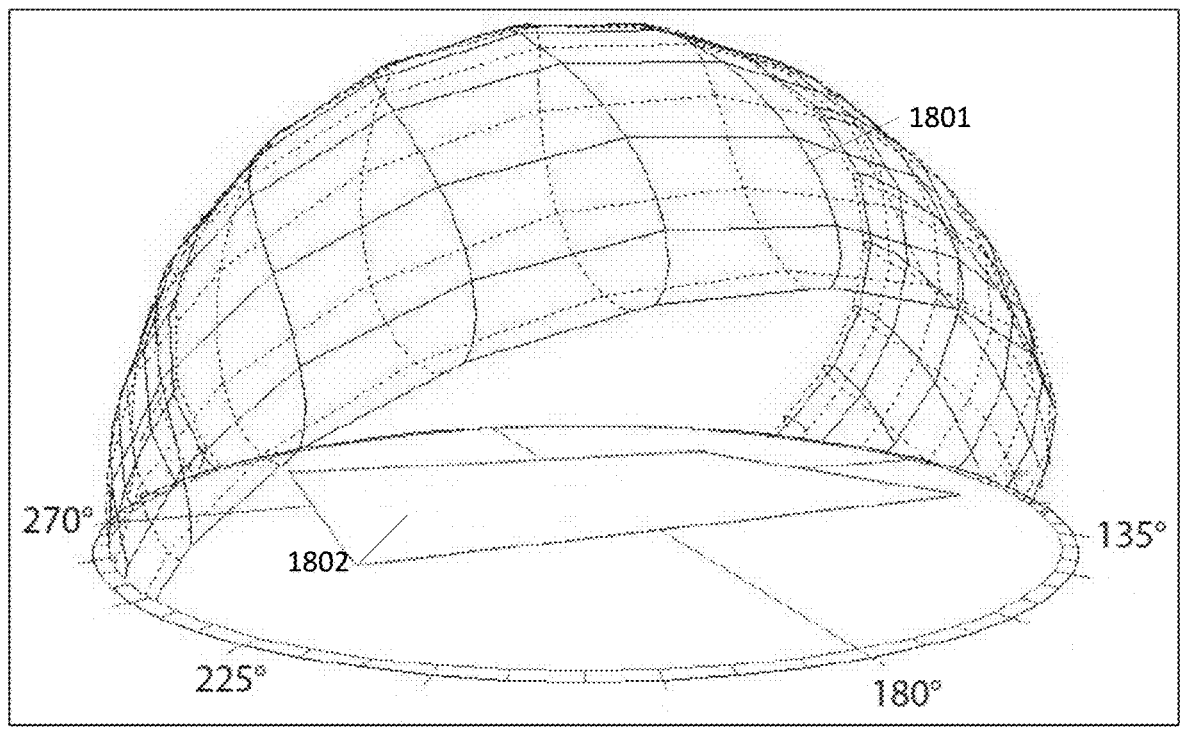
FIGS. 18A-18B illustrate the process for importing solar paths into the three-dimensional model according to an exemplary embodiment.
Figure 18B:
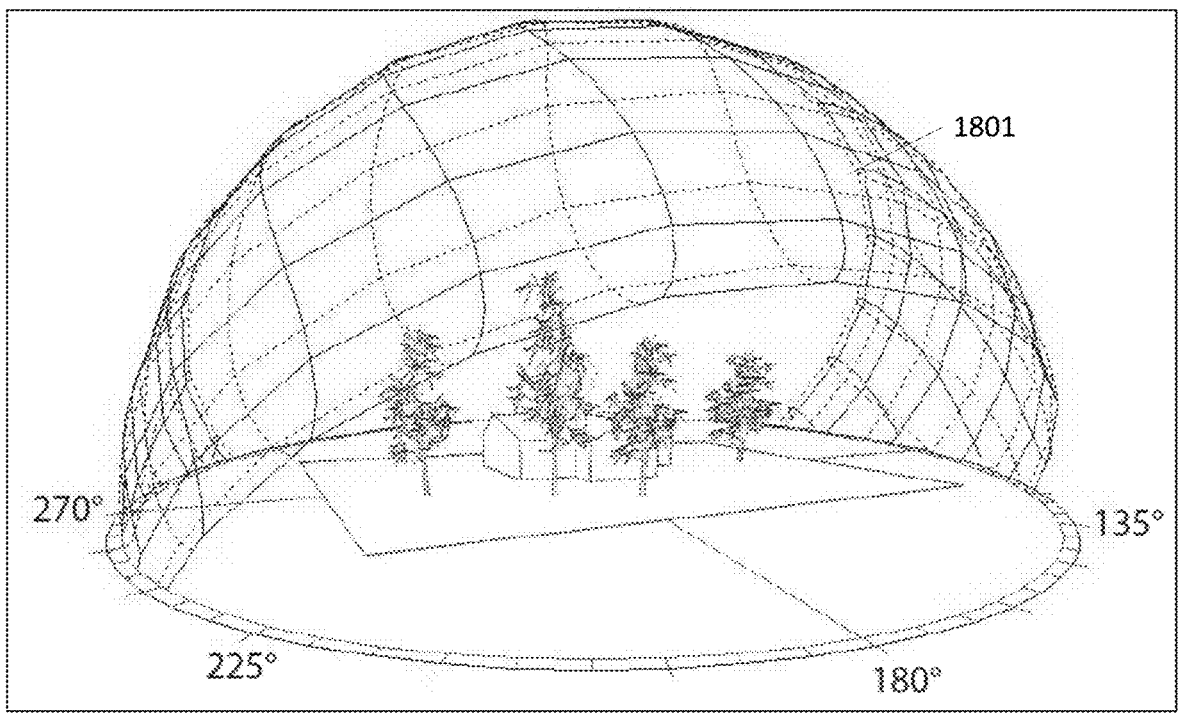

The one or more solar paths can correspond to the locations of the sun at multiple points during the day, on multiple days of the year, and on multiple months of the year. The one or more solar paths can include all solar paths for an entire calendar year. For example, FIG. 18A illustrates a three dimensional structure 1801 which represents all of the solar paths for a calendar year. As shown in FIG. 18B, this three-dimensional structure can be imported into a three-dimensional model of the solar site 1802.

The one or more solar paths can be imported from any suitable data source, such as a meteorological, astronomical, geological, or weather-related database or website. Additionally, the one or more imported solar paths are selected based on the geo-location of the solar site. This geo-location can correspond to an aggregate location, such as the center point in the solar site, or to a specific point within the solar site. The geo-location can be identified by a user or can be identified using a GPS device in the UAV which performed the assessment of the solar site.

Returning to FIG. 11, at step 1103 one or more solar collection estimates corresponding to one or more locations in the solar site are determined based at least in part on the three-dimensional model and the one or more solar paths. This process is described with reference to FIG. 19, which illustrates a flowchart for determining one or more solar collection estimates corresponding to one or more locations in the solar site based at least in part on the three-dimensional model and the one or more solar paths according to an exemplary embodiment.

Figure 20:
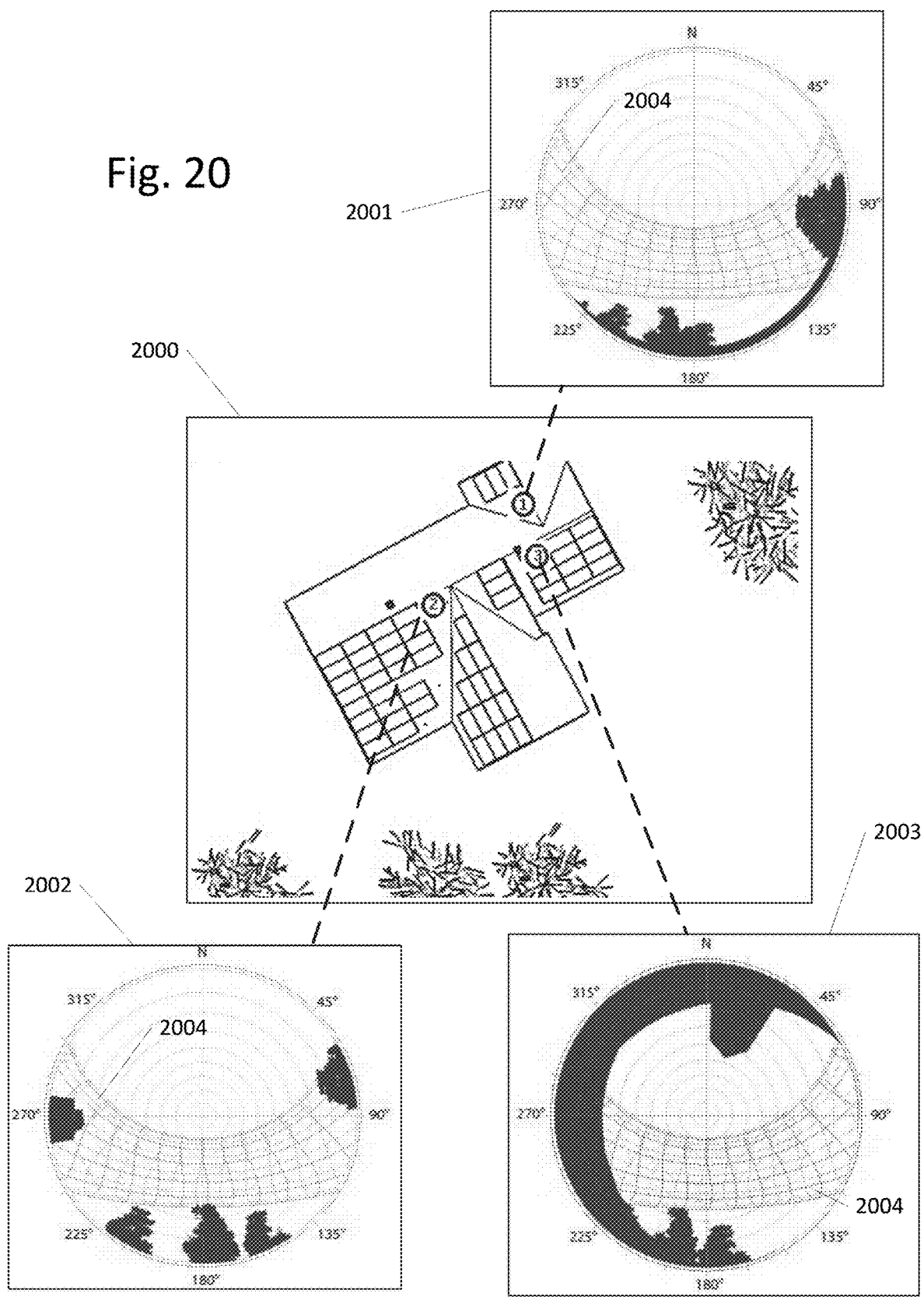
FIG. 20 illustrates three hemispherical viewsheds corresponding to three points in a three-dimensional model of a solar site according to an exemplary embodiment.

At step 1901 one or more points in the three-dimensional model corresponding to the one or more locations in the solar site are identified. For example, FIG. 20 illustrates a three-dimensional model of a solar site 2000 in which three points (marked 1, 2, and 3) have been identified corresponding to three locations in the physical solar site. The points in the three-dimensional model can be identified or selected by a user through a user interface which displays the three-dimensional model, for example, by having a user click on the potential spots they are considering for a solar installation.

At step 1902 one or more hemispherical viewsheds corresponding to the one or more points are generated based at least in part on the three-dimensional model and the one or more solar paths. The one or more hemispherical viewsheds incorporate at least some of the one or more solar paths which have been imported into the three-dimensional model. FIG. 20 illustrates an example of three hemispherical viewsheds 2001, 2002, and 2003 corresponding to points 1, 2, and 3, respectively. As shown in FIG. 20, these hemispherical viewsheds all incorporate the one or more sunpaths 2004.

Figure 21:
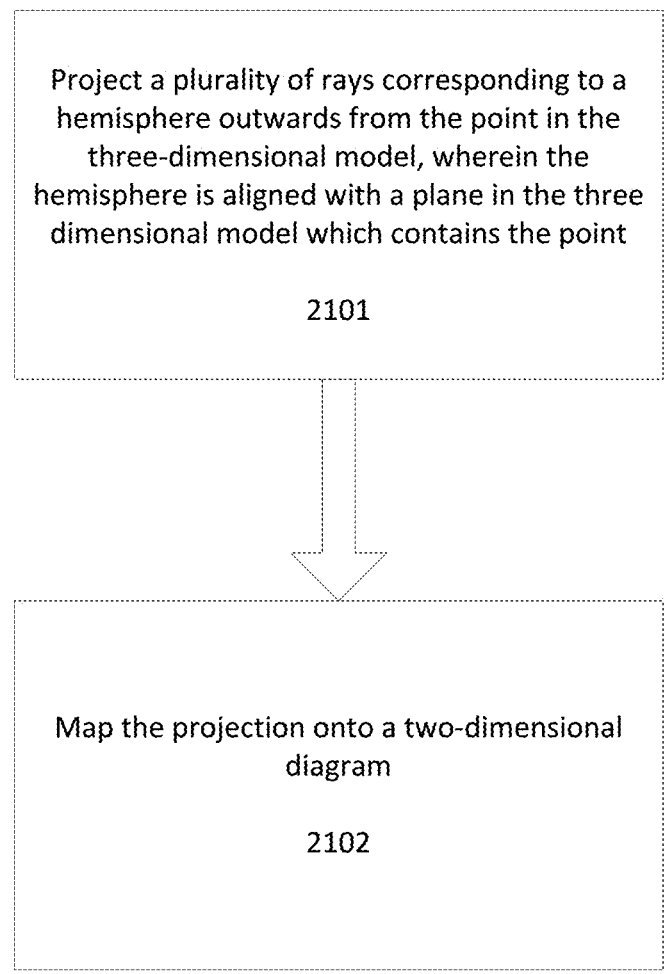
FIG. 21 illustrates a flowchart for generating the one or more hemispherical viewsheds for each of the one or more hemispherical viewsheds corresponding to each of the one or more points in the three-dimensional model according to an exemplary embodiment.

Each of the hemispherical viewsheds corresponds to a projection of an outward ray-tracing from a particular point in three-dimensional space. FIG. 21 illustrates a flowchart for generating the one or more hemispherical viewsheds for each of the one or more locations corresponding to each of the one or more points in the three-dimensional model according to an exemplary embodiment.

At step 2101 a plurality of rays corresponding to a hemisphere are projected outwards from the corresponding point in the three-dimensional model, wherein the hemisphere is aligned with a plane in the three-dimensional model which contains the point. In other words, the hemisphere forms part of a sphere which is bisected by the plane containing the point. For example, if the plane was at angle of 22 degrees relative to the ground, then the hemisphere would be oriented 22 degrees relative to the ground to be in alignment with the plane.

The plane can correspond to a surface, such as a roof of a building in the three-dimensional model. Since the three-dimensional model is generated based on the actual solar site using geo-referenced points, the plane in the three-dimensional model on which the point lies captures the actual tilt (angle) and orientation of the physical surface in the solar site, and the azimuth at the geo-location of the solar site.

Figure 22:
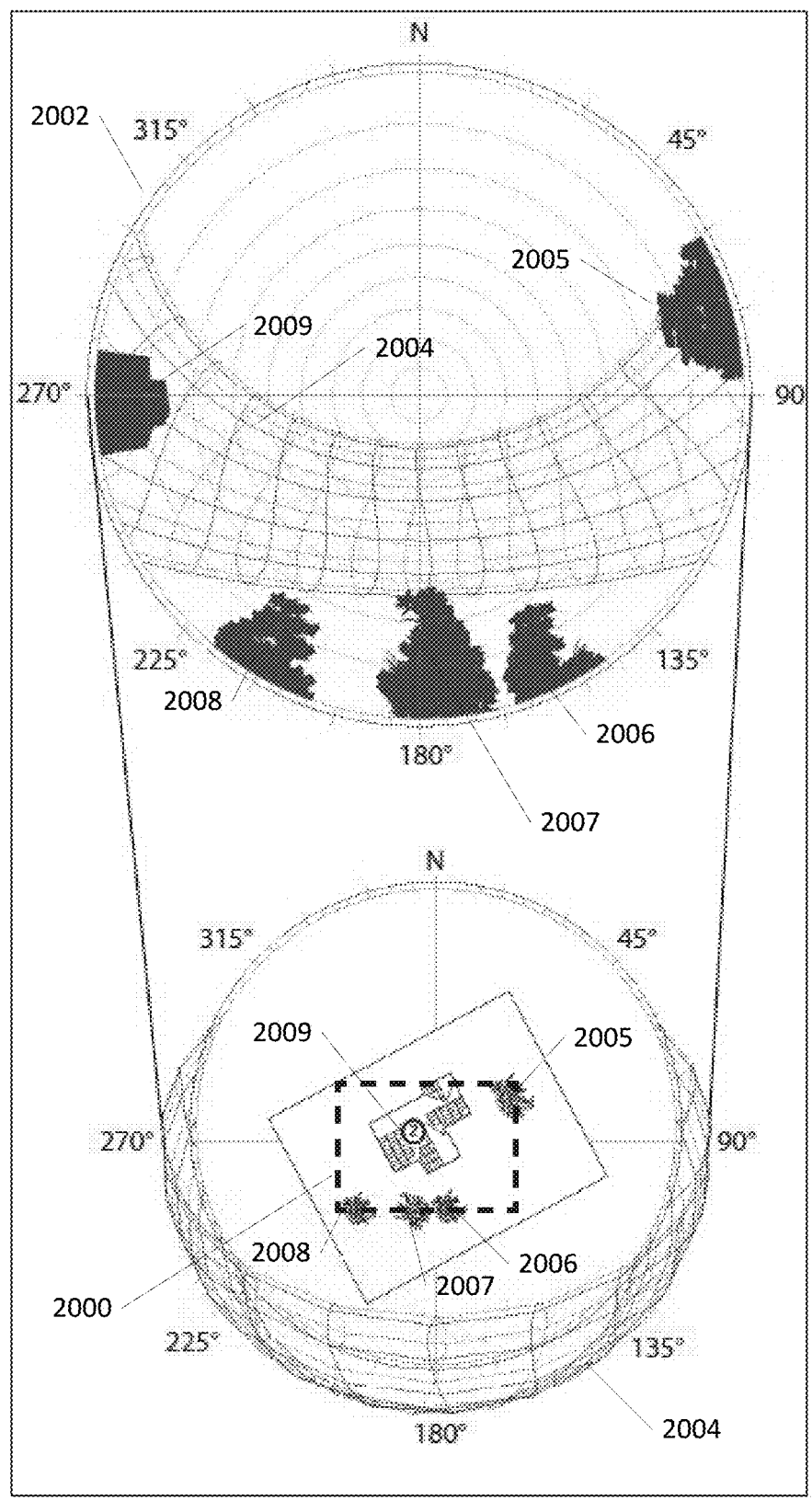
FIG. 22 illustrates an example of this projection used to generate a hemispherical viewshed according to an exemplary embodiment.

At step 2102, the projection is mapped onto a diagram, such as a sterographic diagram, which forms the hemispherical viewshed. FIG. 22 illustrates an example of this projection. The solar site 2000 in FIG. 22 is the same as the solar site 2000 in FIG. 20 and the hemispherical viewshed 2002 is the same as the hemispherical viewshed 2002 in FIG. 20 which corresponds to the point marked 2 in FIG. 20. As shown in FIG. 22, all of the objects which are in the path of the plurality of rays corresponding to the hemisphere projected outwards from the point marked 2 are reflected in the hemispherical viewshed 2002. These include trees 2005, 2006, 2007, and 2008, as well as the sunpaths 2004 and an elevated portion of the building 2009 which is adjacent to the point marked 2.

Figure 23A:
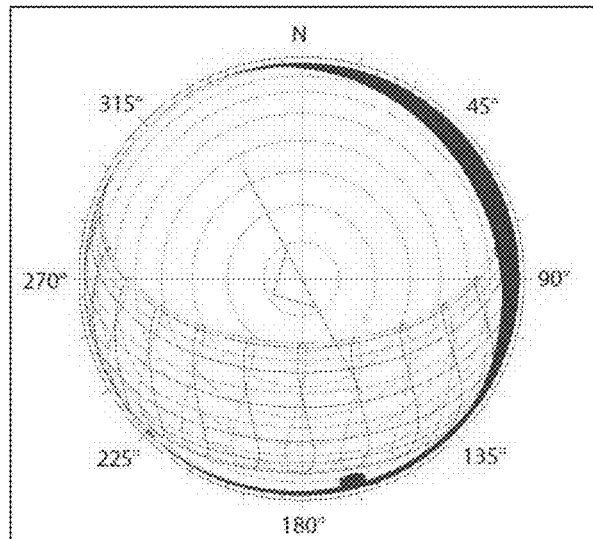
FIGS. 23A-23C illustrate different possible projection diagrams according to an exemplary embodiment.
Figure 23B:
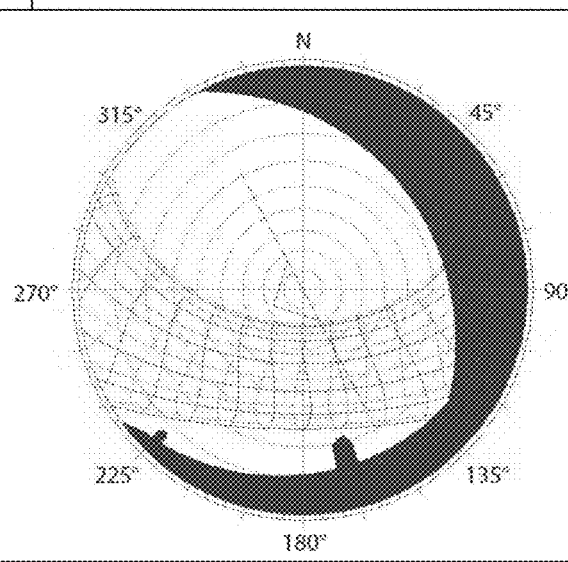

Of course, the diagram which the projection is mapped onto does not have to be a stereographic diagram generated by a stereographic projection, as is shown in FIG. 23B. A stereographic projection is one in which azimuth lines are first projected back to a reference point located a distance of 1 radius beneath the circle center. The point where each of these lines intersects the zero axis gives the radial distance. The primary advantage of a stereographic projection is that it increases the resolution of the diagram at low solar altitudes making it more suitable for the majority of surrounding building overshadowing situations.

The diagram can also be a spherical projection diagram, which is illustrated in FIG. 23A and in which the radial distance from the center is the cosine of the altitude angle. Spherical projection diagrams are useful for considering overhead shading or very tall surrounding buildings.

Figure 23C:
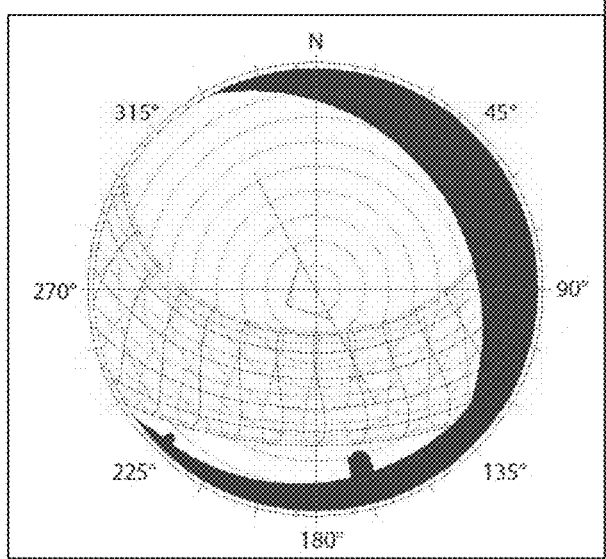

Additionally, the diagram can be an equidistant projection diagram, as shown in FIG. 23C, and in which the radial distance is a linear factor of the altitude angle. In an equidistant projection diagram, the relative change in radius between all angles is the same, so there is no bias towards either the zenith or the horizon. Of course, the type of projection and resulting diagram can be based on characteristics of the solar site which is being assessed.

Figure 19:
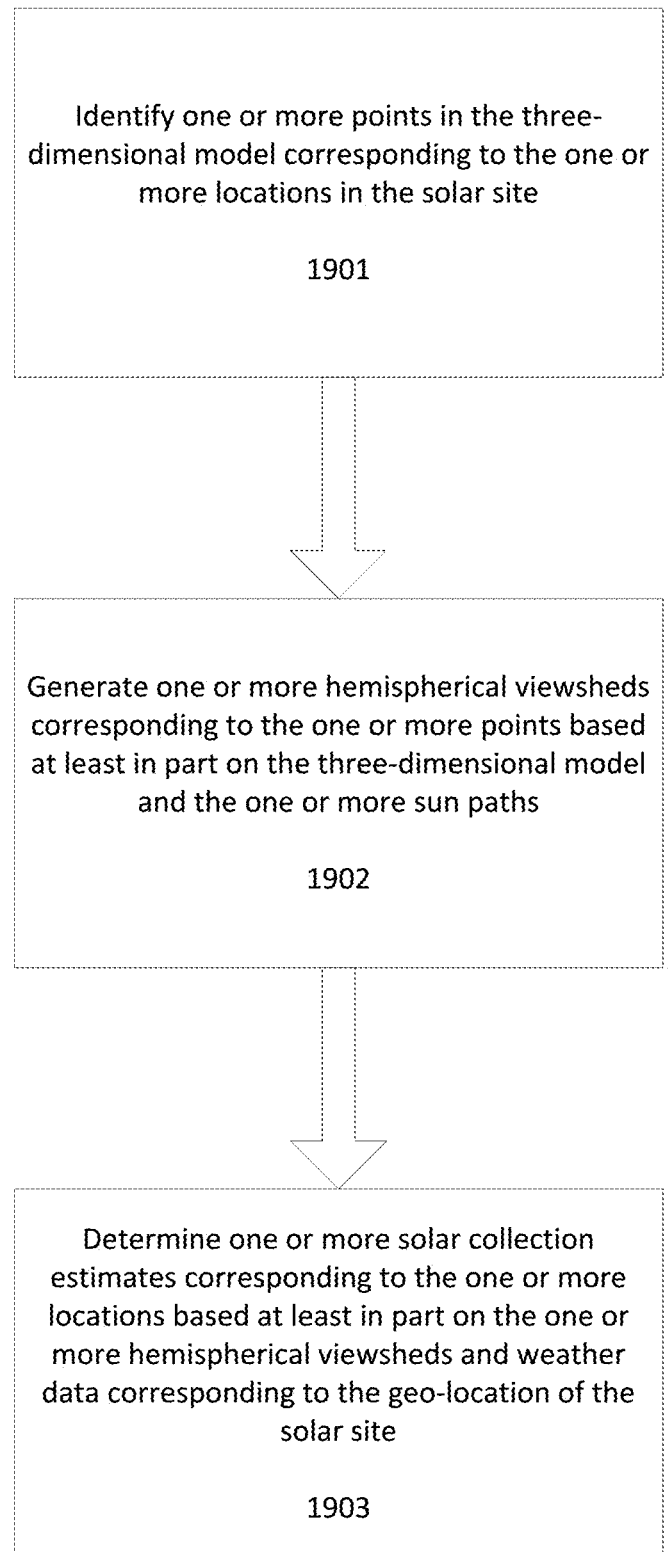
FIG. 19 illustrates a flowchart for determining one or more solar collection estimates corresponding to one or more locations in the solar site based at least in part on the three-dimensional model and the one or more solar paths according to an exemplary embodiment.

Regardless of the type of projection used, after the hemispherical viewsheds corresponding to the one or more points are generated, then at step 1903 of FIG. 19 one or more solar collection estimates corresponding to the one or more locations are generated based at least in part on the one or more hemispherical viewsheds and weather data corresponding to the geo-location of the solar site. The weather data can be imported from an external source, such as a Department of Energy website or server, and can include information such as the solar insolation at the geo-location of the solar site over a period of time (such as a year).

Since the hemispherical viewsheds capture tilt, orientation, azimuth, and shading caused by obstructions in the solar path for any point in the three-dimensional model, the hemispherical viewsheds can be used in conjunction with the weather data to calculate a variety of solar collection metrics or estimates. These include annual solar access percentage (the percentage of solar radiation lost to shade), a Tilt and Orientation Factor ("TOF"—the solar insolation at the actual tilt and orientation divided by the insolation at the optimum tilt and orientation), a Total Solar Resource Fraction (TSRF—the ratio of insolation available accounting for both shading and TOF, compared to the total insolation available at a given location at the optimum tilt and orientation and with no shading), and solar stress (the amount of solar energy received) for any location in the solar site.

Additionally, when solar collection estimates are calculated for a plurality of locations in the solar site, the solar collection estimates corresponding to multiple locations in the plurality of locations can be combined. This is useful for locations which correspond to points which lie in a single plane of the three-dimensional model. For example, State departments and banks require a minimum of four hemispherical viewsheds per roof plane in a solar site. In this case, solar collection estimates can be determined for four or more locations on each roof plane (corresponding to four or more points on each plane in the three dimensional model) and combined to generate an average solar collection estimate for each of the roof planes.

One of the many advantages of the present system is that it allows for the calculation of hypothetical solar collection estimates without actually requiring any physical transformation to the physical environment of the solar site, since the solar site is modeled in three-dimensional space with all of the necessary information to make a solar collection estimate.

This is particularly useful when determining hypothetical solar collection estimates that would result based on changes to an environment surrounding the buildings in a solar site. The objects in the three-dimensional model can be classified as building structures (which include potential locations for solar panels) and environmental structures (which do not include potential locations for solar panels). All of the points for which solar collection estimates are generated lie on the one or more housing structures. Therefore, new (hypothetical) solar collection estimates can be generated by manipulating the environmental structures.

Figure 24:
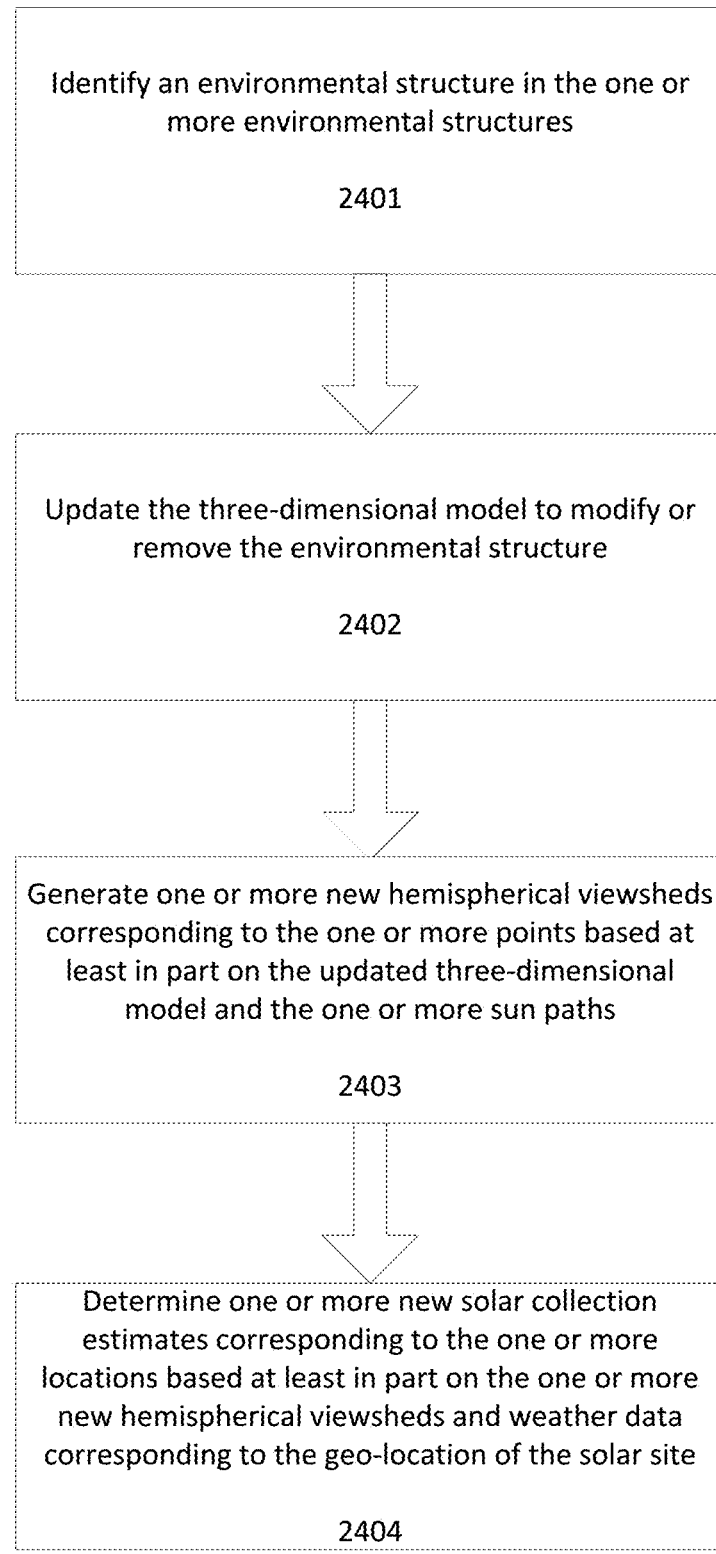
FIG. 24 illustrates a flowchart for determining one or more new solar collection estimates according to an exemplary embodiment.

FIG. 24 illustrates a flowchart for determining one or more new solar collection estimates according to an exemplary embodiment. At step 2401 an environmental structure in of the three-dimensional model is identified. This environmental structure can be identified based on a determination that is obstructing a solar path or may obstruct a solar path in the future.

At step 2402 the three-dimensional model is updated to modify or remove the identified environmental structure. At step 2403 one or more new hemispherical viewsheds corresponding to the one or more points are generated based at least in part on the updated three-dimensional model and the one or more solar paths, wherein the one or more new hemispherical viewsheds incorporate the one or more solar paths.

At step 2404 one or more new solar collection estimates corresponding to the one or more locations are determined based at least in part on the one or more new hemispherical viewsheds and weather data corresponding to the geolocation of the solar site.

Figure 25A:
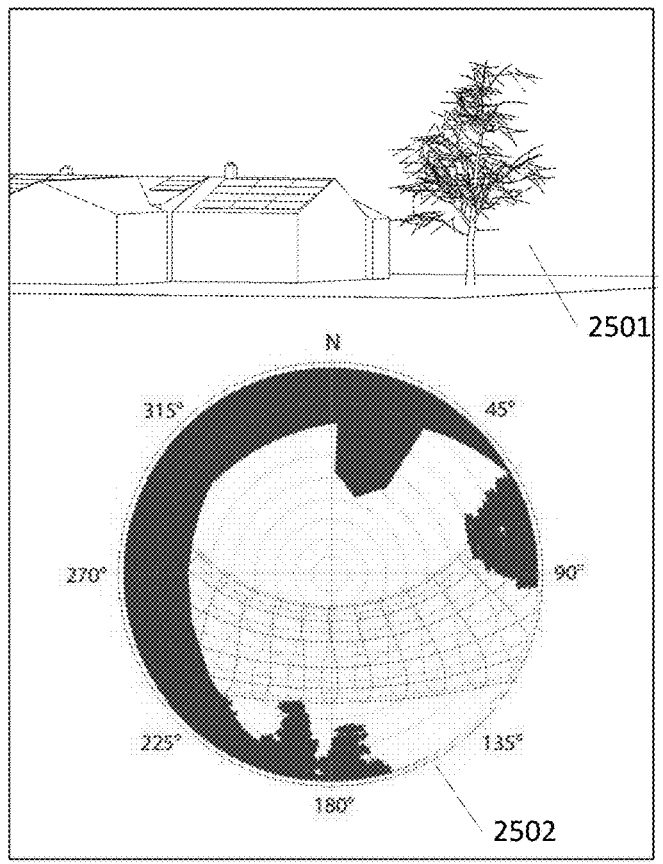
FIGS. 25A-25B illustrate an example of removing an environmental object from the three-dimensional object according to an exemplary embodiment.
Figure 25B:
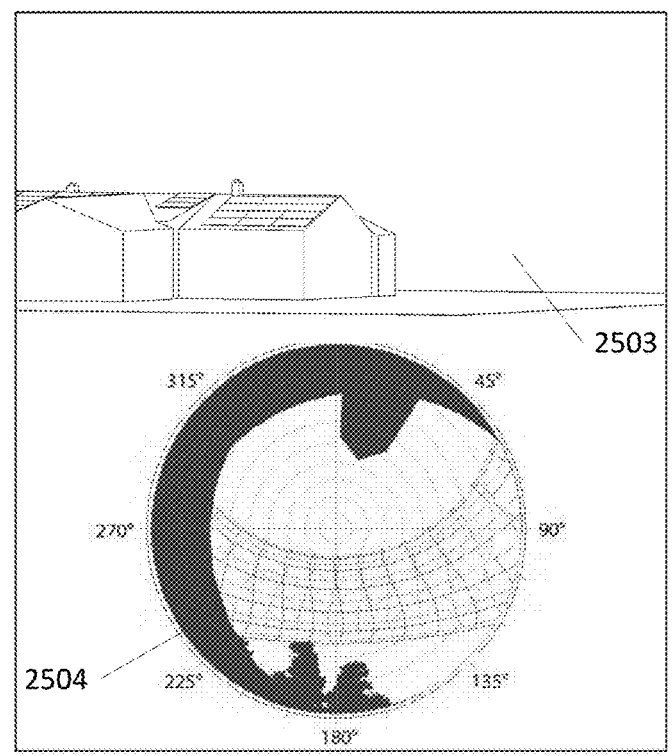

The identified environmental structure can lie between the one or more solar paths and the one or more points used to determine solar collection estimates. In this case, the three-dimensional model can be updated to remove the identified environmental structure. FIGS. 25A-25B illustrate an example of this with a tree 2501 which is obstructing one or more solar paths as shown in hemispherical viewshed 2502. When the tree is removed and replaced with an empty space 2503, the updated hemispherical viewshed 2504 for the same point reflects the change and does not include the obstruction. Based on the updated hemispherical viewshed, a user can determine the additional gains in solar connection associated with removal of the tree, without having to actually chop down the tree.

Another application of the method illustrated in FIG. 24 is determining the change in solar collection based on the growth of an identified environmental structure. This can include generating a growth prediction for an identified environmental structure, wherein the growth prediction estimates an amount of growth of the identified environmental structure over a predetermined period of time. The three-dimensional model can then be updated to increase the size of the identified environmental structure based on the growth prediction and a new solar collection estimate can be determined.

Figure 26:
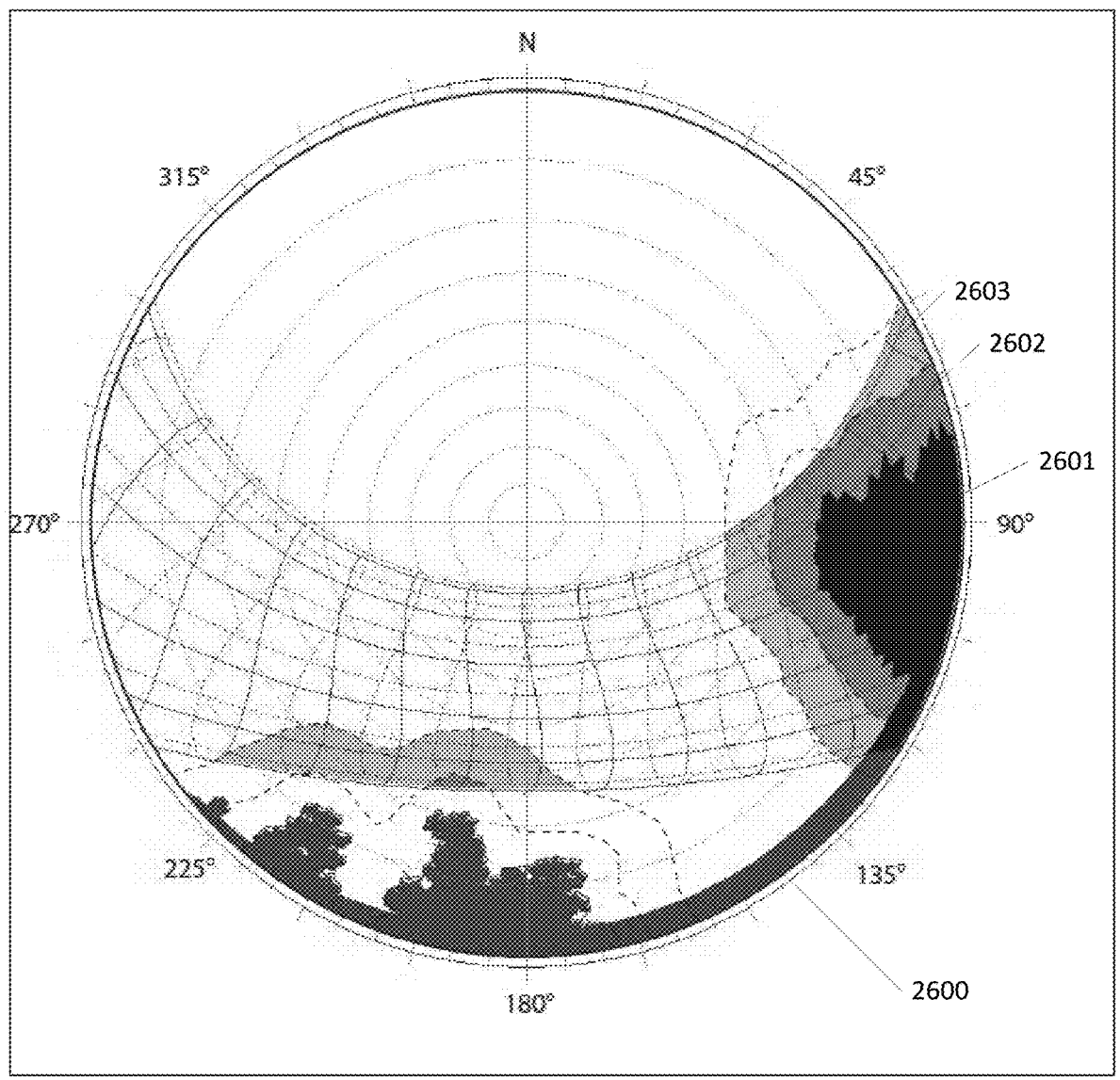
FIG. 26 illustrates an example of modeling the growth of an environmental object according to an exemplary embodiment.

FIG. 26 illustrates an example of this. The hemispherical viewshed 2600 in FIG. 26 includes the current shading caused by a tree 2601, an outline of the shading that will be caused by the tree in 10 years 2602 based on a growth prediction, and an outline of the shading that will be caused by the tree in 20 years 2603 based on a growth prediction. As discussed above, the projected growth and increase in shading can be used to determine the impact of the environmental object (in this case a tree) on the solar collection estimates over time.

Figure 27A:
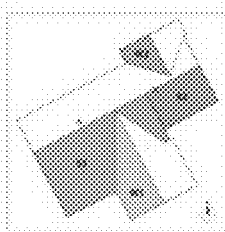
FIGS. 27A-27B illustrate a solar collection report according to an exemplary embodiment.
Figure 27A:
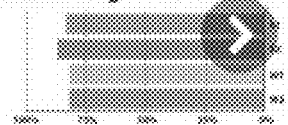
Figure 27A:
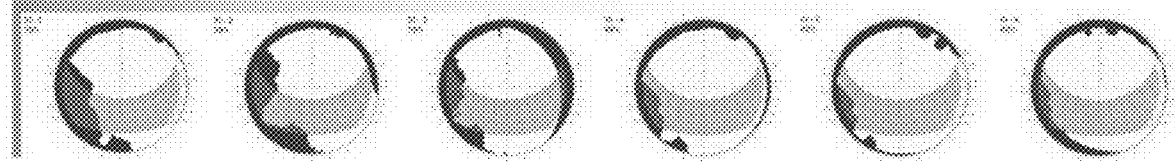
Figure 27A:
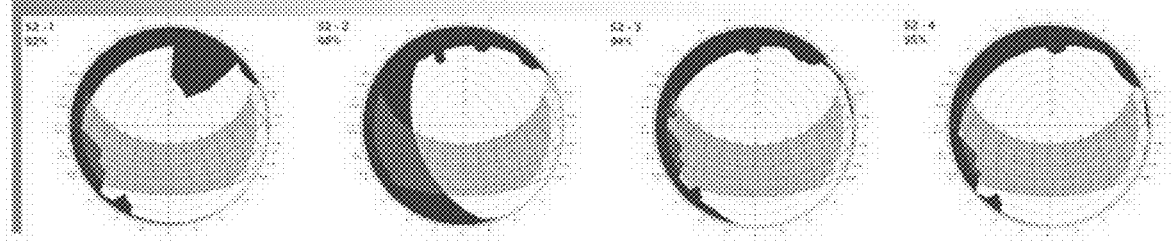
Figure 27B:
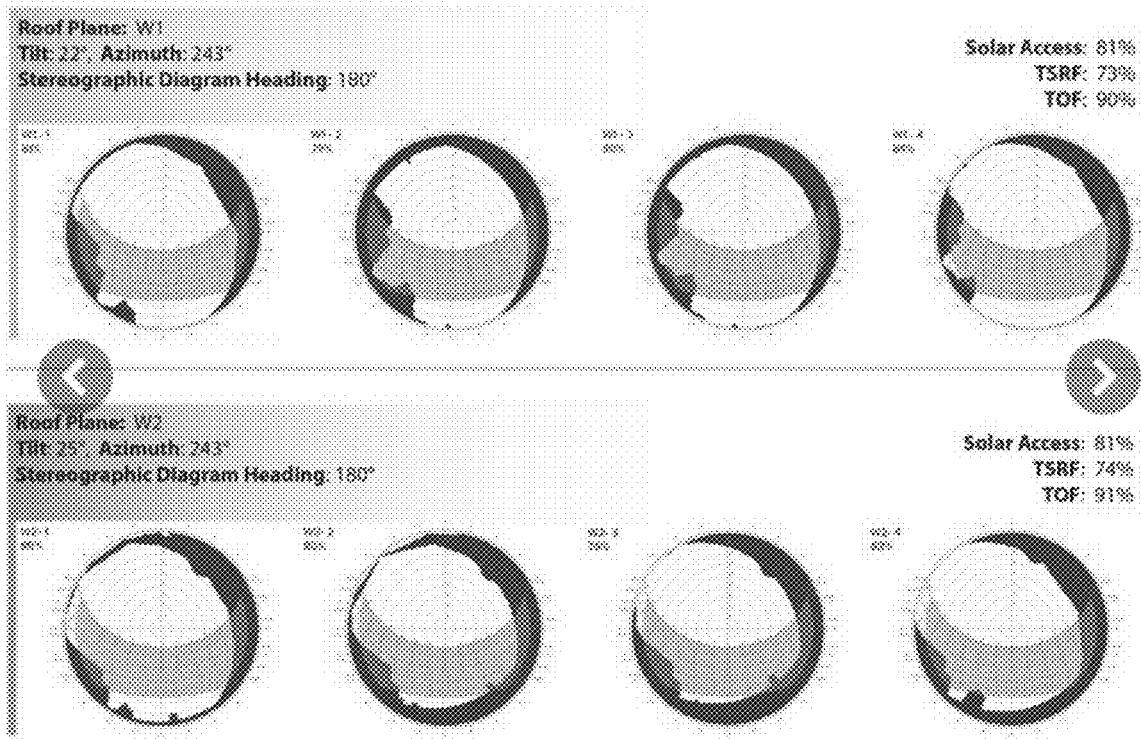

The one or more solar collection estimates for the solar site can be summarized and presented in a report, such as the one shown in FIGS. 27A-27B. The report in FIGS. 27A-27B includes solar collection estimates for four roof planes of a solar site, S1, S2, W1, and W2. As shown in the figures, the solar collection estimates for each of the roof planes have been generated by combining solar collection estimates for multiple locations on each of the corresponding roof planes.

Figure 28:
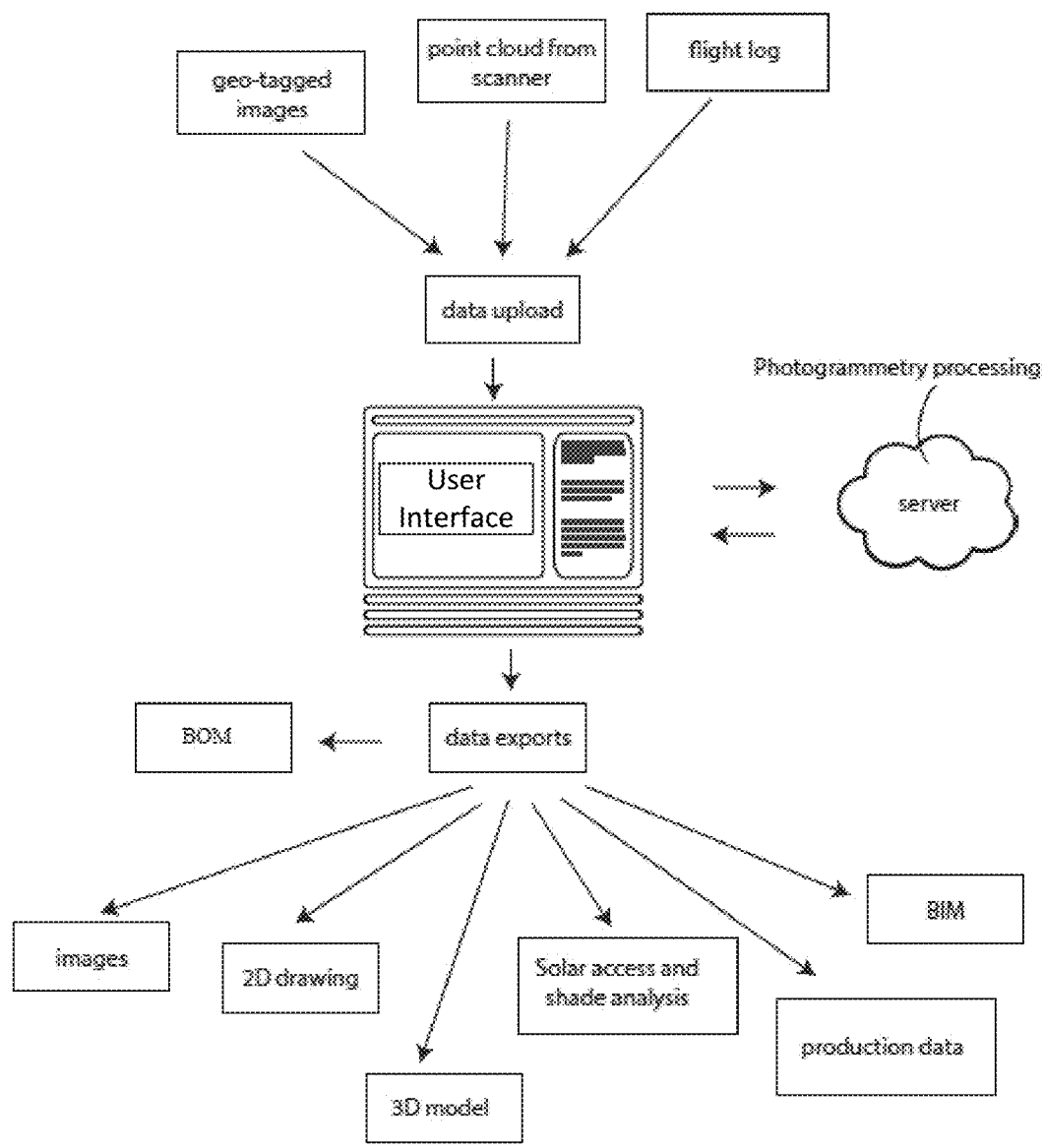
FIG. 28 illustrates a diagram showing the various potential inputs and outputs of the system for solar site assessment according to an exemplary embodiment.

In addition to solar collection estimates, there are a variety of applications of the methods and systems disclosed herein. FIG. 28 illustrates a diagram showing the various potential inputs and outputs of the system for solar site assessment. The inputs can include data captured by the UAV, such as geo-tagged images, a point cloud captured using a three-dimensional scanner or depth sensor, and/or a flight log which can contain location information and flight times.

The outputs can include one or more images of the solar site, the three-dimensional model, and two-dimensional drawings of the solar site such as Computer Aided Design (CAD) drawings which can be generated from the three-dimensional model using parallel projection per roof plane or parallel projection on the Z-axis. The outputs can also include a Building Information Analysis (BIM) which can be generated by incorporating building data such as fuel sources, insulation types and ratings, and other building materials and variables. The outputs can further include the solar access and shade analysis including the solar collection estimates, solar production data, and a Bill of Materials (BOM).

As shown in FIG. 28, the system includes a user interface which can be web-based or which can be accessed via a locally stored program and which can be used to implement the functionality described throughout the application. The user interface allows users to select any locations on a roof or plane of a structure in the three dimensional model or select a module (plane) within the three-dimensional model to generate corresponding hemispherical viewsheds and determine solar collection estimates for the selected locations.

The user interface can also include modeling functionality to allow users to design their own photovoltaic system on the three-dimensional model and calculate the corresponding electrical output generated by their photovoltaic system. The electrical output can be calculated based at least in part on the hardware used in the system, and the locations of the hardware, and the solar collection estimates calculated for the locations of the hardware (which can be determined using the methods and systems described herein). The modeling functionality can also import or be linked to a library of hardware profiles corresponding to photovoltaic modules, inverters, disconnects, racking, and wire types with corresponding sizes which are used to calculate the electrical output of the designed photovoltaic system. The modeling functionality can further allow users to manipulate the three-dimensional model, such as for extruding conduits within the three-dimensional model.

Additionally, as shown in FIG. 28, the system can include a server configured to perform the photogrammetry processing described in this application. Alternatively, the photogrammetry processing can be performed on a local computing device.

The devices and methods described throughout this application can be used in various permutations. For example, the solar site estimates determined based on the three-dimensional model can be used to select a winning site as described with reference to FIG. 5. Various other combinations and permutations are possible and these examples are not intended to be limiting.

Figure 29:
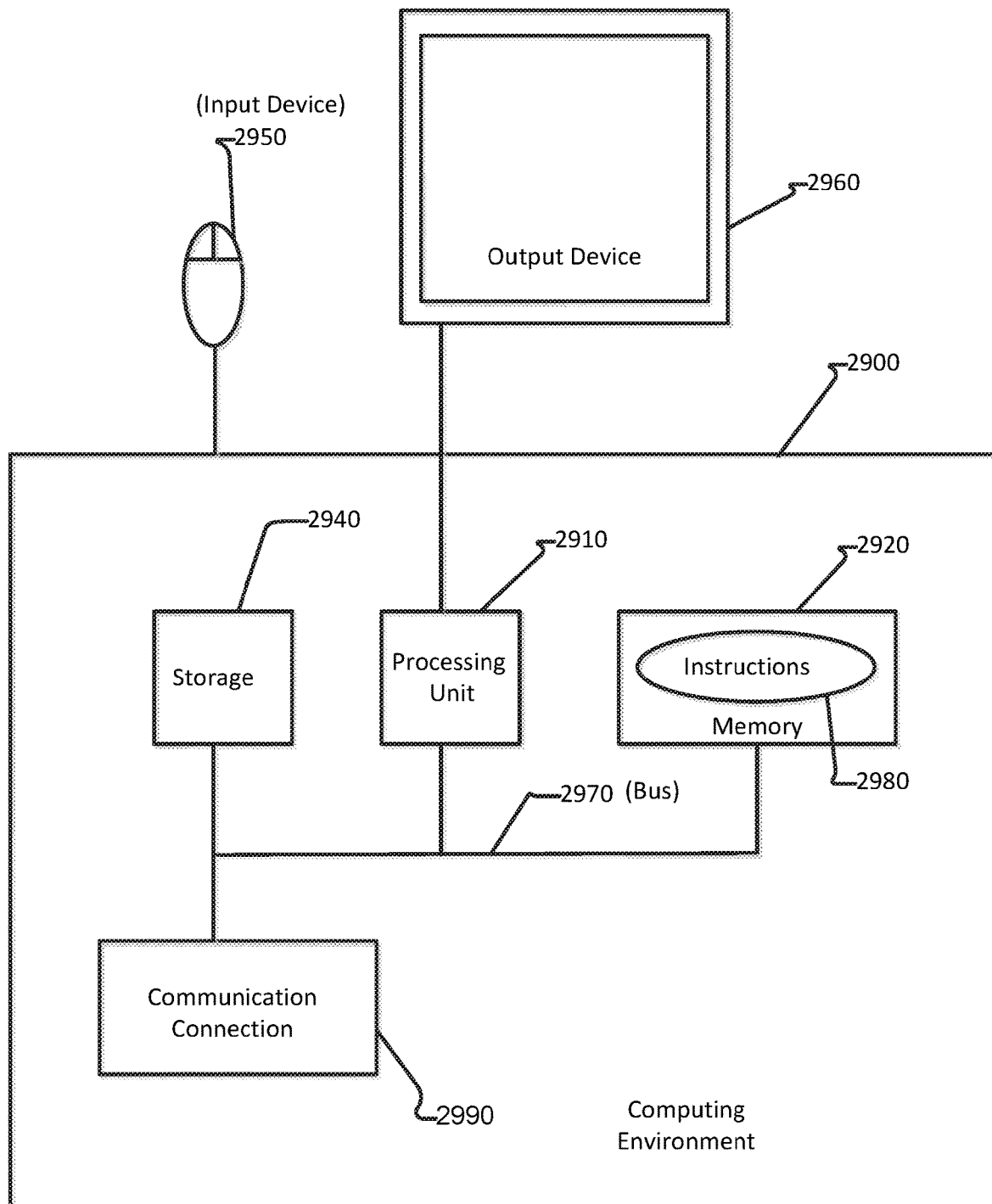
FIG. 29 illustrates an exemplary computing environment that forms part of the method and system for solar site assessment according to an exemplary embodiment.

One or more of the above-described techniques may be implemented in or involve one or more computer systems. FIG. 29 illustrates a generalized example of a computing environment 2900. The computing environment 2900 is not intended to suggest any limitation as to scope of use or functionality of a described embodiment. Computing environment 2900 can be used to perform any of the steps described in this application and/or can be part of the UAV devices described in this application.

With reference to FIG. 29, the computing environment 2900 includes at least one processing unit 2910 and memory 2920. The processing unit 2910 executes computer-executable instructions and may be a real or a virtual processor. In a multi-processing system, multiple processing units execute computer-executable instructions to increase processing power. The memory 2920 may be volatile memory (e.g., registers, cache, RAM), non-volatile memory (e.g., ROM, EEPROM, flash memory, etc.), or some combination of the two. The memory 2920 may store software instructions 2980 for implementing the described techniques when executed by one or more processors. Memory 2920 may be one memory device or multiple memory devices.

A computing environment may have additional features. For example, the computing environment 2900 includes storage 2940, one or more input devices 2950, one or more output devices 2960, and one or more communication connections 2990. An interconnection mechanism 2970, such as a bus, controller, or network interconnects the components of the computing environment 2900. Typically, operating system software or firmware (not shown) provides an operating environment for other software executing in the computing environment 2900, and coordinates activities of the components of the computing environment 2900.

The storage 2940 may be removable or non-removable, and includes magnetic disks, magnetic tapes or cassettes, CD-ROMs, CD-RWs, DVDs, or any other medium which may be used to store information and which may be accessed within the computing environment 2900. The storage 2940 may store instructions for the software 2980.

The input device(s) 2950 may be a touch input device such as a keyboard, mouse, pen, trackball, touch screen, or game controller, a voice input device, a smayning device, a digital camera, remote control, or another device that provides input to the computing environment 2900. The output device(s) 2960 may be a display, television, monitor, printer, speaker, or another device that provides output from the computing environment 2900.

The communication connection(s) 2990 enable communication over a communication medium to another computing entity. The communication medium conveys information such as computer-executable instructions, audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

Implementations may be described in the general context of computer-readable media. Computer-readable media are any available media that may be accessed within a computing environment. By way of example, and not limitation, within the computing environment 2900, computer-readable media include memory 2920, storage 2940, communication media, and combinations of any of the above.

Of course, FIG. 29 illustrates computing environment 2900, display device 2960, and input device 2950 as separate devices for ease of identification only. Computing environment 2900, display device 2960, and input device 2950 may be separate devices (e.g., a personal computer connected by wires to a monitor and mouse), may be integrated in a single device (e.g., a mobile device with a touch-display, such as a smartphone or a tablet), or any combination of devices (e.g., a computing device operatively coupled to a touch-screen display device, a plurality of computing devices attached to a single display device and input device, etc.). Computing environment 2900 may be a set-top box, mobile device, personal computer, or one or more servers, for example a farm of networked servers, a clustered server environment, or a cloud network of computing devices.

Having described and illustrated the principles of our invention with reference to the described embodiment, it will be recognized that the described embodiment may be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of the described embodiment shown in software may be implemented in hardware and vice versa.

In view of the many possible embodiments to which the principles of our invention may be applied, we claim as our invention all such embodiments as may come within the scope and spirit of the following claims and the present disclosure and equivalents thereto.

What is claimed is:

1. A method executed by one or more computing devices for solar site assessment, the method comprising:
   generating, by at least one of the one or more computing devices, a three-dimensional model of a solar site based at least in part on data captured by an Unmanned Aerial Vehicle (UAV);
   updating, by at least one of the one or more computing devices, the three-dimensional model to incorporate a three-dimensional structure corresponding to a plurality of solar paths representing the position of the sun over a calendar year based at least in part on a geo-location of the solar site;
   identifying, by at least one of the one or more computing devices, one or more points in the updated three-dimensional model corresponding to the one or more locations in the solar site;
   determining, by at least one of the one or more computing devices, a rate of growth of an environmental structure within the three-dimensional model, the rate of growth indicating; an amount of growth of the environmental structure over time;
   generating, by at least one of the one or more computing devices, a plurality of sets of one or more hemispherical viewsheds corresponding to the one or more points over a plurality of intervals in a period of time by, for each interval in the plurality of intervals:
      determining a change-in-size of the environmental structure based at least in part on the rate of growth of the environmental structure;
      updating a size of the environmental structure within the updated three-dimensional model based at least in part on the determined change-in-size;
      generating one or more hemispherical projections corresponding to the one or more points, each hemispherical projection corresponding to an outward projection of a plurality of rays corresponding to a hemisphere from the corresponding point in the updated three-dimensional model; and
      mapping the one or more hemispherical projections onto one or more sterographic diagrams to thereby generate a set of one or more hemispherical viewsheds, wherein each hemispherical viewshed captures shading caused by obstructions in the plurality of solar paths for a corresponding point in the three-dimensional model and wherein the obstructions correspond to objects that are in the path of the plurality of rays projected outwards in the corresponding hemispherical projection; and
   determining, by at least one of the one or more computing devices, one or more solar collection estimates corresponding to the one or more locations over the period of time based at least in part on the plurality of sets of one or more hemispherical viewsheds.

2. The method of claim 1, wherein the rate of growth is a positive rate of growth and indicates an increase in a size of the environmental structure over time.

3. The method of claim 1, wherein generating a three-dimensional model of a solar site based at least in part on data captured by a UAV comprises:
- receiving a plurality of images of the solar site captured by one or more cameras of the UAV, wherein each of the plurality of images is geo-tagged with location information corresponding to the location of the UAV at the time of image capture;
- generating a point cloud of the solar site in three-dimensional space based at least in part on the plurality of images and the corresponding location information for each of the plurality of images; and
- generating the three-dimensional model of the solar site based at least in part on the point cloud.

4. The method of claim 3, wherein generating a point cloud of the solar site in three-dimensional space based at least in part on the plurality of images and the corresponding location information for each of the plurality of images comprises: identifying a plurality of common points which are captured in at least two or more images of the plurality of images; and mapping the plurality of common points into three-dimensional space based on the corresponding location information for each of the at least two or more images.

5. The method of claim 4, wherein the point cloud comprises a first point cloud and wherein generating a three-dimensional model of a solar site based at least in part on data captured by a UAV further comprises:
- receiving sensor data of the solar site captured by one or more sensors of the UAV;
- generating a second point cloud of the solar site in three-dimensional space based at least in part on the received sensor data; and
- generating the three-dimensional model of the solar site based at least in part on the first point cloud, the second point cloud, and one or more reference points which occur in both the first point cloud and the second point cloud.

6. The method of claim 5, wherein the one or more sensors comprise one or more of a three-dimensional sensor and a depth sensor.

7. The method of claim 1, further comprising:
- modifying, by at least one of the one or more computing devices, the three-dimensional model of the solar site.

8. The method of claim 7, wherein modifying the three-dimensional model comprises one or more of: reducing the number of polygons used to render one or more objects in the three-dimensional model of the solar site and removing one or more objects in the three-dimensional model which are below a predetermined elevation.

9. The method of claim 1, wherein the one or more locations comprise a plurality of locations and further comprising:
- combining solar collection estimates corresponding to two or more locations in the plurality of locations, wherein the two or more locations correspond to two or more points which lie in a single plane of the three-dimensional model.

10. The method of claim 1, wherein the three-dimensional model includes one or more building structures, wherein the one or more points lie on the one or more building structures, and further comprising:
- identifying, by at least one of the one or more computing devices, a second environmental structure within the three-dimensional model;
- updating, by at least one of the one or more computing devices, the three-dimensional model to modify or remove the second environmental structure;
- generating, by at least one of the one or more computing devices, a plurality of new sets of one or more hemispherical viewsheds corresponding to the one or more points over the plurality of intervals in a period of time; and
- determining, by at least one of the one or more computing devices, one or more new solar collection estimates corresponding to the one or more locations over the period of time based at least in part on the plurality of new sets of one or more hemispherical viewsheds.

11. The method of claim 10, wherein the second environmental structure lies between the one or more solar paths and the one or more points and wherein the three-dimensional model is updated to remove the second environmental structure.

12. The method of claim 1, wherein the one or more solar collection estimates comprise one or more of an annual solar access percentage, a Tilt and Orientation Factor, a Total Solar Resource Fraction, and solar stress.

13. The method of claim 1, wherein each point in the one or more points lies on a corresponding plane within the three-dimensional model and wherein each hemispherical image corresponding to each point captures a hemisphere that is formed by a bisection of a sphere along the plane corresponding to that point.

14. The method of claim 1, wherein each hemispherical viewshed in the one or more hemispherical viewsheds captures at least a portion of the imported one or more solar paths and at least a portion of the three-dimensional model of the solar site.

15. An apparatus for solar site assessment, the apparatus comprising:
- one or more processors; and
- one or more memories operatively coupled to at least one of the one or more processors and having instructions stored thereon that, when executed by at least one of the one or more processors, cause at least one of the one or more processors to:
  - generate a three-dimensional model of a solar site based at least in part on data captured by an Unmanned Aerial Vehicle (UAV);
  - update the three-dimensional model to incorporate a three-dimensional structure corresponding to a plurality of solar paths representing the position of the sun over a calendar year based at least in part on a geo-location of the solar site;
  - identify one or more points in the updated three-dimensional model corresponding to the one or more locations in the solar site;
  - determine a rate of growth of an environmental structure within the three-dimensional model, the rate of growth indicating; an amount of growth of the environmental structure over time;
  - generate a plurality of sets of one or more hemispherical viewsheds corresponding to the one or more points over a plurality of intervals in a period of time by, for each interval in the plurality of intervals:
    - determining a change-in-size of the environmental structure based at least in part on the rate of growth of the environmental structure;
    - updating a size of the environmental structure within the updated three-dimensional model based at least in part on the determined change-in-size;
    - generating one or more hemispherical projections corresponding to the one or more points, each hemispherical projection corresponding to an outward projection of a plurality of rays corresponding to a hemisphere from the corresponding point in the updated three-dimensional model; and mapping the one or more hemispherical projections onto one or more sterographic diagrams to thereby generate a set of one or more hemispherical viewsheds, wherein each hemispherical viewshed captures shading caused by obstructions in the plurality of solar paths for a corresponding point in the three-dimensional model and wherein the obstructions correspond to objects that are in the path of the plurality of rays projected outwards in the corresponding hemispherical projection; and determine one or more solar collection estimates corresponding to the one or more locations over the period of time based at least in part on the plurality of sets of one or more hemispherical viewsheds.

16. The apparatus of claim 15, wherein the rate of growth is a positive rate of growth and indicates an increase in a size of the environmental structure over time.

17. The apparatus of claim 15, wherein each point in the one or more points lies on a corresponding plane within the three-dimensional model and wherein each hemispherical image corresponding to each point captures a hemisphere that is formed by a bisection of a sphere along the plane corresponding to that point.

18. The apparatus of claim 15, wherein each hemispherical viewshed in the one or more hemispherical viewsheds captures at least a portion of the imported one or more solar paths and at least a portion of the three-dimensional model of the solar site.

19. The apparatus of claim 15, wherein the three-dimensional model includes one or more building structures, wherein the one or more points lie on the one or more building structures, and wherein at least one of the one or more memories has further instructions stored thereon that, when executed by at least one of the one or more processors, cause at least one of the one or more processors to:

identify a second environmental structure within the three-dimensional model;

update the three-dimensional model to modify or remove the second environmental structure;

generate a plurality of new sets of one or more hemispherical viewsheds corresponding to the one or more points over the plurality of intervals in a period of time; and determine one or more new solar collection estimates corresponding to the one or more locations over the period of time based at least in part on the plurality of new sets of one or more hemispherical viewsheds.

20. The apparatus of claim 15, wherein the one or more solar collection estimates comprise one or more of an annual solar access percentage, a Tilt and Orientation Factor, a Total Solar Resource Fraction, and solar stress.

21. At least one non-transitory computer-readable medium storing computer-readable instructions that, when executed by one or more computing devices, cause at least one of the one or more computing devices to:

generate a three-dimensional model of a solar site based at least in part on data captured by an Unmanned Aerial Vehicle (UAV);

update the three-dimensional model to incorporate a three-dimensional structure corresponding to a plurality of solar paths representing the position of the sun over a calendar year based at least in part on a geolocation of the solar site;

identify one or more points in the updated three-dimensional model corresponding to the one or more locations in the solar site;

determine a rate of growth of an environmental structure within the three-dimensional model, the rate of growth indicating; an amount of growth of the environmental structure over time;

generate a plurality of sets of one or more hemispherical viewsheds corresponding to the one or more points over a plurality of intervals in a period of time by, for each interval in the plurality of intervals:

determining a change-in-size of the environmental structure based at least in part on the rate of growth of the environmental structure;

updating a size of the environmental structure within the updated three-dimensional model based at least in part on the determined change-in-size;

generating one or more hemispherical projections corresponding to the one or more points, each hemispherical projection corresponding to an outward projection of a plurality of rays corresponding to a hemisphere from the corresponding point in the updated three-dimensional model; and mapping the one or more hemispherical projections onto one or more sterographic diagrams to thereby generate a set of one or more hemispherical viewsheds, wherein each hemispherical viewshed captures shading caused by obstructions in the plurality of solar paths for a corresponding point in the three-dimensional model and wherein the obstructions correspond to objects that are in the path of the plurality of rays projected outwards in the corresponding hemispherical projection; and determine one or more solar collection estimates corresponding to the one or more locations over the period of time based at least in part on the plurality of sets of one or more hemispherical viewsheds.

22. The apparatus of claim 21, wherein the rate of growth is a positive rate of growth and indicates an increase in a size of the environmental structure over time.

23. The at least one non-transitory computer-readable medium of claim 21, wherein each point in the one or more points lies on a corresponding plane within the three-dimensional model and wherein each hemispherical image corresponding to each point captures a hemisphere that is formed by a bisection of a sphere along the plane corresponding to that point.

24. The at least one non-transitory computer-readable medium of claim 21, wherein each hemispherical viewshed in the one or more hemispherical viewsheds captures at least a portion of the imported one or more solar paths and at least a portion of the three-dimensional model of the solar site.

25. The at least one non-transitory computer-readable medium of claim 21, wherein the three-dimensional model includes one or more building structures, wherein the one or more points lie on the one or more building structures, and further storing computer-readable instructions that, when executed by at least one of the one or more computing devices, cause at least one of the one or more computing devices to:

identify a second environmental structure within the three-dimensional model;

update the three-dimensional model to modify or remove the second environmental structure;

generate a plurality of new sets of one or more hemispherical viewsheds corresponding to the one or more points over the plurality of intervals in a period of time; and determine one or more new solar collection estimates corresponding to the one or more locations over the period of time based at least in part on the plurality of new sets of one or more hemispherical viewsheds.

26. The at least one non-transitory computer-readable medium of claim 21, wherein the one or more solar collection estimates comprise one or more of an annual solar access percentage, a Tilt and Orientation Factor, a Total Solar Resource Fraction, and solar stress.

* * * * *